(12) United States Patent
Lee et al.

(10) Patent No.: US 10,396,105 B2
(45) Date of Patent: Aug. 27, 2019

(54) DISPLAY SUBSTRATE AND METHOD OF MANUFACTURING THE SAME

(71) Applicant: Samsung Display Co., Ltd., Yongin-Si, Gyeonggi-Do (KR)

(72) Inventors: Hyoung-Cheol Lee, Suwon-si (KR); Hyung-June Kim, Anyang-si (KR); Wan-Soon Im, Cheonan-si (KR); Tae-Kyung Yim, Seoul (KR); Joon-Gun Chong, Yongin-si (KR); Jong-Hak Hwang, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 15/679,409

(22) Filed: Aug. 17, 2017

(65) Prior Publication Data

US 2017/0345848 A1    Nov. 30, 2017

Related U.S. Application Data

(62) Division of application No. 14/986,695, filed on Jan. 3, 2016, now Pat. No. 9,768,206.

(30) Foreign Application Priority Data

Apr. 8, 2015  (KR) .................. 10-2015-0049798

(51) Int. Cl.
 *H01L 27/12* (2006.01)
 *H01L 29/66* (2006.01)
 (Continued)

(52) U.S. Cl.
 CPC ...... *H01L 27/1259* (2013.01); *G02F 1/13394* (2013.01); *H01L 27/124* (2013.01);
 (Continued)

(58) Field of Classification Search
 CPC .......... H01L 27/1259; H01L 29/66969; H01L 29/78693; H01L 29/66765; H01L 27/124;
 (Continued)

(56) References Cited

U.S. PATENT DOCUMENTS

| 8,730,273 | B2 | 5/2014 | Chu-Ke et al. |
| 2011/0242443 | A1 | 10/2011 | Choi et al. |
| 2013/0242367 | A1 | 9/2013 | Cho et al. |

FOREIGN PATENT DOCUMENTS

| KR | 1020060075814 A | 7/2006 |
| KR | 1020070001531 A | 1/2007 |
| KR | 1020070037114 A | 4/2007 |

*Primary Examiner* — Sonya D. McCall-Shepard
(74) *Attorney, Agent, or Firm* — Cantor Colburn LLP

(57) ABSTRACT

A display substrate includes a base substrate comprising a plurality of sub-pixels, a first switching element disposed on the base substrate and electrically connected to a gate line extending in a first direction and a data line extending in a second direction crossing the first direction, a color filter layer disposed on the switching element and comprising a red color filter, a green color filter, a blue color filter and a white color filter alternately disposed on the plurality of sub-pixels, respectively, a column spacer disposed on the color filter and comprising the same material as that of the white color filter, an insulation layer disposed on the color filter and the column spacer and a pixel electrode disposed on the insulation layer.

10 Claims, 31 Drawing Sheets

(51) Int. Cl.
  *H01L 29/786*  (2006.01)
  *G02F 1/1339*  (2006.01)
  *G02F 1/1362*  (2006.01)
  *G02F 1/1333*  (2006.01)
  *G09G 3/36*    (2006.01)

(52) U.S. Cl.
  CPC .. *H01L 29/66765* (2013.01); *H01L 29/66969* (2013.01); *H01L 29/78669* (2013.01); *H01L 29/78693* (2013.01); *G02F 1/133345* (2013.01); *G02F 2001/136222* (2013.01); *G09G 3/3607* (2013.01); *G09G 2300/0426* (2013.01); *G09G 2300/0452* (2013.01); *G09G 2320/0233* (2013.01)

(58) Field of Classification Search
  CPC .......... H01L 29/78669; G02F 1/13394; G02F 2001/136222; G02F 1/133345; G09G 2300/0426; G09G 2300/0452; G09G 2320/0233; G09G 3/3607
  See application file for complete search history.

DISPLAY SUBSTRATE AND METHOD OF MANUFACTURING THE SAME

This application is a divisional of U.S. patent application Ser. No. 14/986,695, filed on Jan. 3, 2016, which claims priority to Korean Patent Application No. 10-2015-0049798, filed on Apr. 8, 2015, and all the benefits accruing therefrom under 35 U.S.C. § 119, the content of which in its entirety is herein incorporated by reference.

BACKGROUND

1. Field

Exemplary embodiments of the invention relate to a display substrate and method of manufacturing the display substrate. More particularly, the invention relates to a display substrate for a liquid crystal display and method of manufacturing the display substrate.

2. Description of the Related Art

In general, a liquid crystal display ("LCD") includes an LCD including a plurality of scan lines and a plurality of data lines, a gate driving circuit supplying gate driving signals to the plurality of scan lines, and a data driving circuit for supplying data signals to the plurality of data lines. The LCD includes a lower substrate on which a pixel electrode is formed, an upper substrate on which a common electrode is formed, and a liquid crystal layer inserted between the lower substrate and the upper substrate and applies a voltage to the electrodes to re-arrange the liquid crystal molecules of the liquid crystal layer and to control the transmittance of the light that passes through the liquid crystal layer. Red (R), green (G), and blue (B) pixels are formed in the liquid crystal panel and the pixels are driven by the signals applied to the scan lines and the data lines so that a display operation is performed.

As the resolution of the LCD increases, the aperture ratio of the liquid crystal panel is reduced so that a brightness of each of the pixels deteriorates. In order to solve this problem, a pixel structure in a Pentile method is provided. In the pixel structure of the Pentile method, the blue unit pixel is shared when two dots are displayed. The data signals are transmitted to adjacent blue unit pixels by one data driving circuit, and the adjacent blue unit pixels are driven by different gate driving circuits.

SUMMARY

In order to improve brightness, the RGBW method in which a white (W) pixel is added to the red (R), green (G), and blue (B) pixels is provided. However, since the white (W) pixel is added, an addition mask forming the white (W) pixel may be needed.

Exemplary embodiments of the invention provide a display substrate capable of decreasing the number of masks.

Exemplary embodiments of the invention further provide a method of manufacturing the display substrate.

In an exemplary embodiment of a display substrate according to the invention, the display substrate includes a base substrate including a plurality of sub-pixels, a first switching element disposed on the base substrate and electrically connected to a gate line extending in a first direction and a data line extending in a second direction crossing the first direction, a color filter layer disposed on the switching element and including a red color filter, a green color filter, a blue color filter and a white color filter alternately disposed on the plurality of sub-pixels, a column spacer disposed on the color filter and including the same material as that of the white color filter, an insulation layer disposed on the color filter layer and the column spacer and a pixel electrode disposed on the insulation layer.

In an exemplary embodiment, the sub-pixels may include a light-blocking area, a high-pixel area disposed adjacent to the light-blocking area and a low-pixel area disposed opposite to the high-pixel area with reference to the light-blocking area.

In an exemplary embodiment, the red color filter may be disposed on a first sub-pixel. The green color filter may be disposed on a second sub-pixel adjacent to the first sub-pixel. The blue color filter may be disposed on a third sub-pixel adjacent to the second sub-pixel and a light-blocking area of a fourth sub-pixel adjacent to the third sub-pixel. The white color filter may be disposed on a high-pixel area of the fourth sub-pixel and a low-pixel area of the fourth sub-pixel.

In an exemplary embodiment, the red color filter may be disposed on a high-pixel area of a first sub-pixel and a low-pixel area of the first sub-pixel. The green color filter may be disposed on a high-pixel area of a second sub-pixel adjacent to the first sub-pixel and a low-pixel area of the second sub-pixel. The blue color filter may be disposed on a third sub-pixel adjacent to the second sub-pixel, a light-blocking area of the first sub-pixel, a light-blocking area of the second sub-pixel and a light-blocking area of a fourth sub-pixel adjacent to the third sub-pixel. The white color filter may be disposed on a high-pixel area of the fourth sub-pixel and a low-pixel area of the fourth sub-pixel.

In an exemplary embodiment, the red color filter may be disposed on a first sub-pixel and a light-blocking area of a fourth sub-pixel adjacent to the first sub-pixel. The green color filter may be disposed on a second sub-pixel adjacent to the first sub-pixel. The blue color filter may be disposed on a third sub-pixel adjacent to the second sub-pixel. The white color filter may be disposed on a high-pixel area of the fourth sub-pixel and a low-pixel area of the fourth sub-pixel.

In an exemplary embodiment, the red color filter may be disposed on a first sub-pixel, a light-blocking area of a second sub-pixel adjacent to the first sub-pixel, a light-blocking area of a third sub-pixel adjacent to the second sub-pixel and a light-blocking area of a fourth sub-pixel adjacent to the first sub-pixel. The green color filter may be disposed on a high-pixel area of the second sub-pixel and a low-pixel area of the second sub-pixel. The blue color filter may be disposed on a high-pixel area of the third sub-pixel and a low-pixel area of the third sub-pixel. The white color filter may be disposed on a high-pixel area of the fourth sub-pixel and a low-pixel area of the fourth sub-pixel.

In an exemplary embodiment, the red color filter may be disposed on a high-pixel area of a first sub-pixel and a low-pixel area of the first sub-pixel. The green color filter may be disposed on a second sub-pixel adjacent to the first sub-pixel, a light-blocking area of the first sub-pixel, a light-blocking area of a third sub-pixel adjacent to the second sub-pixel and a light-blocking area of a fourth sub-pixel adjacent to the first sub-pixel. The blue color filter may be disposed on a high-pixel area of the third sub-pixel and a low-pixel area of the third sub-pixel. The white color filter may be disposed on a high-pixel area of the fourth sub-pixel and a low-pixel area of the fourth sub-pixel.

In an exemplary embodiment, the pixel electrode may be electrically connected to the first switching element through a contact hole passing the color filter layer disposed on the light-blocking area.

In an exemplary embodiment, the pixel electrode may include a high-pixel electrode and a low-pixel electrode spaced apart from the high-pixel electrode.

In an exemplary embodiment, the display substrate may further include a second switching element electrically connected to the gate line, the data line and the low-pixel electrode and a third switching element electrically connected to the gate line and the second switching element. The first switching element may be electrically connected to the high-pixel electrode.

In an exemplary embodiment of method of manufacturing a display substrate according to the invention, the method includes forming a first switching element electrically connected to a gate line extending in a first direction and a data line extending in a second direction crossing the first direction on a base substrate, forming a red color filter, a green color filter and a blue color filter alternately disposed on the plurality of sub-pixels on the base substrate on which the first switching element is disposed, forming a white color filter and a column spacer including the same material as that of the white color filter on the base substrate on which the red color filter, the green color filter and the blue color filter are disposed, forming an insulation layer on the base substrate on which the red color filter, the green color filter, the blue color filter, the white color filter and a column spacer are disposed and forming a pixel electrode on the insulation layer.

In an exemplary embodiment, the sub-pixels may include a light-blocking area, a high-pixel area disposed adjacent to the light-blocking area and a low-pixel area disposed opposite to the high-pixel area with reference to the light-blocking area.

In an exemplary embodiment, the red color filter may be disposed on a first sub-pixel. The green color filter may be disposed on a second sub-pixel adjacent to the first sub-pixel. The blue color filter may be disposed on a third sub-pixel adjacent to the second sub-pixel and a light-blocking area of a fourth sub-pixel adjacent to the third sub-pixel. The white color filter may be disposed on a high-pixel area of the fourth sub-pixel and a low-pixel area of the fourth sub-pixel.

In an exemplary embodiment, the red color filter may be disposed on a high-pixel area of a first sub-pixel and a low-pixel area of the first sub-pixel. The green color filter may be disposed on a high-pixel area of a second sub-pixel adjacent to the first sub-pixel and a low-pixel area of the second sub-pixel. The blue color filter may be disposed on a third sub-pixel adjacent to the second sub-pixel, a light-blocking area of the first sub-pixel, a light-blocking area of the second sub-pixel and a light-blocking area of a fourth sub-pixel adjacent to the third sub-pixel. The white color filter may be disposed on a high-pixel area of the fourth sub-pixel and a low-pixel area of the fourth sub-pixel.

In an exemplary embodiment, the red color filter may be disposed on a first sub-pixel and a light-blocking area of a fourth sub-pixel adjacent to the first sub-pixel. The green color filter may be disposed on a second sub-pixel adjacent to the first sub-pixel. The blue color filter may be disposed on a third sub-pixel adjacent to the second sub-pixel. The white color filter may be disposed on a high-pixel area of the fourth sub-pixel and a low-pixel area of the fourth sub-pixel.

In an exemplary embodiment, the red color filter may be disposed on a first sub-pixel, a light-blocking area of a second sub-pixel adjacent to the first sub-pixel, a light-blocking area of a third sub-pixel adjacent to the second sub-pixel and a light-blocking area of a fourth sub-pixel adjacent to the first sub-pixel. The green color filter may be disposed on a high-pixel area of the second sub-pixel and a low-pixel area of the second sub-pixel. The blue color filter may be disposed on a high-pixel area of the third sub-pixel and a low-pixel area of the third sub-pixel. The white color filter may be disposed on a high-pixel area of the fourth sub-pixel and a low-pixel area of the fourth sub-pixel.

In an exemplary embodiment, the red color filter may be disposed on a high-pixel area of a first sub-pixel and a low-pixel area of the first sub-pixel. The green color filter may be disposed on a second sub-pixel adjacent to the first sub-pixel, a light-blocking area of the first sub-pixel, a light-blocking area of a third sub-pixel adjacent to the second sub-pixel and a light-blocking area of a fourth sub-pixel adjacent to the first sub-pixel. The blue color filter may be disposed on a high-pixel area of the third sub-pixel and a low-pixel area of the third sub-pixel. The white color filter may be disposed on a high-pixel area of the fourth sub-pixel and a low-pixel area of the fourth sub-pixel.

In an exemplary embodiment, the method may further include patterning the color filter layer disposed on the light-blocking area to define a contact hole after forming the insulation layer.

In an exemplary embodiment, the pixel electrode may include a high-pixel electrode and a low-pixel electrode spaced apart from the high-pixel electrode.

In an exemplary embodiment, the display substrate may further include a second switching element electrically connected to the gate line, the data line and the low-pixel electrode and a third switching element electrically connected to the gate line and the second switching element. The first switching element may be electrically connected to the high-pixel electrode.

According to the exemplary embodiment, the red color filter, the green color filter or the blue color filter is disposed on the light-blocking area of a sub-pixel on which the white color filter is disposed. Thus, contact holes may be defined ordinarily in the light-blocking area of a sub-pixel on which the white color filter. Accordingly, defects of a display apparatus may be decreased.

In addition, the white color filter is provided by the same process as the column spacer, and thus the number of the masks may be decreased. Accordingly, manufacturing cost and manufacturing time may be decreased.

BRIEF DESCRIPTION OF THE DRAWINGS

The above and other exemplary embodiment, features and advantages of the invention will become more apparent by describing in detailed exemplary embodiments thereof with reference to the accompanying drawings, in which.

DETAILED DESCRIPTION

Figure 1:
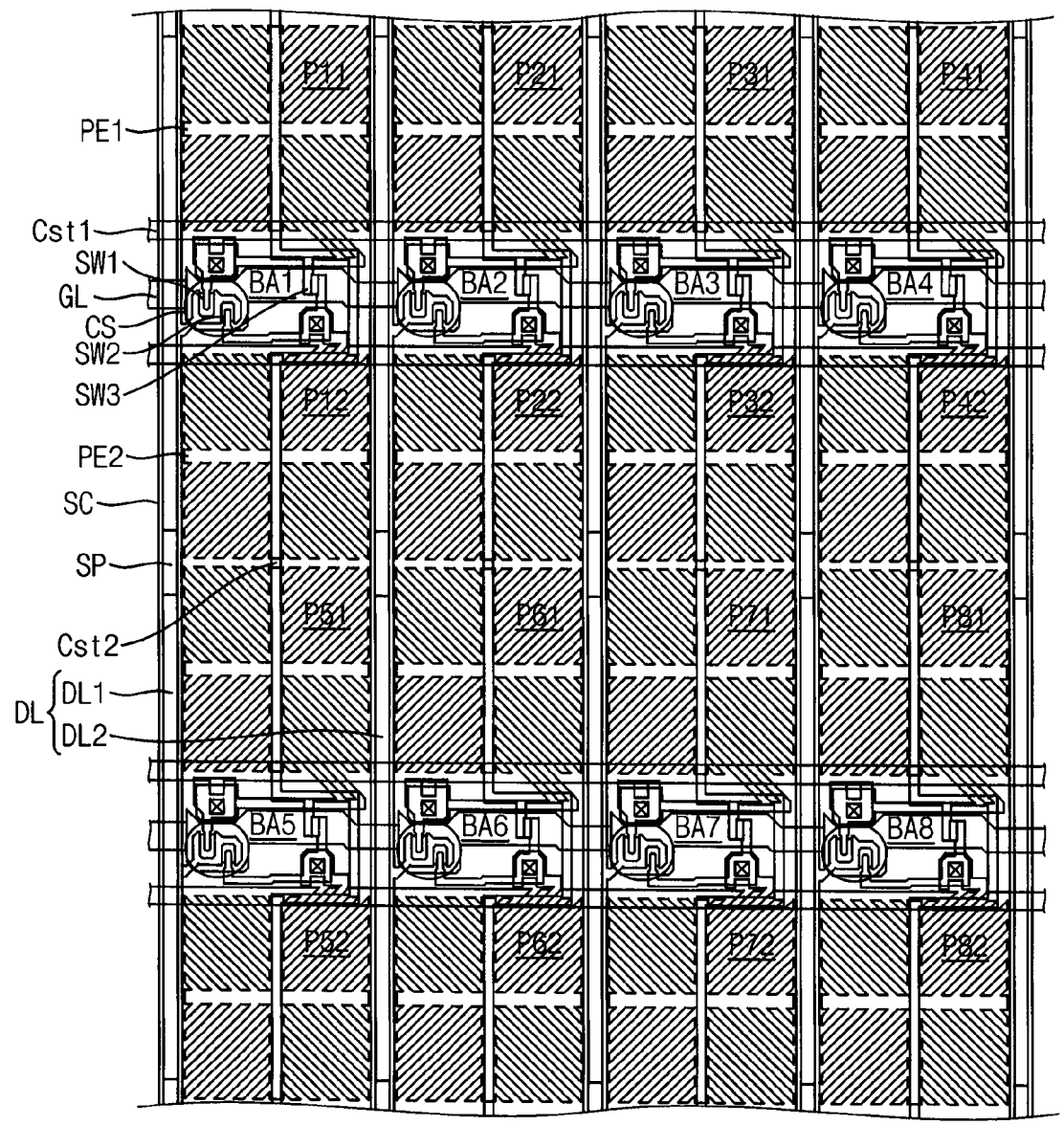
FIG. 1 is a plan view illustrating an exemplary embodiment of a display substrate according to the invention.

Hereinafter, the invention will be explained in detail with reference to the accompanying drawings.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Figure 2:
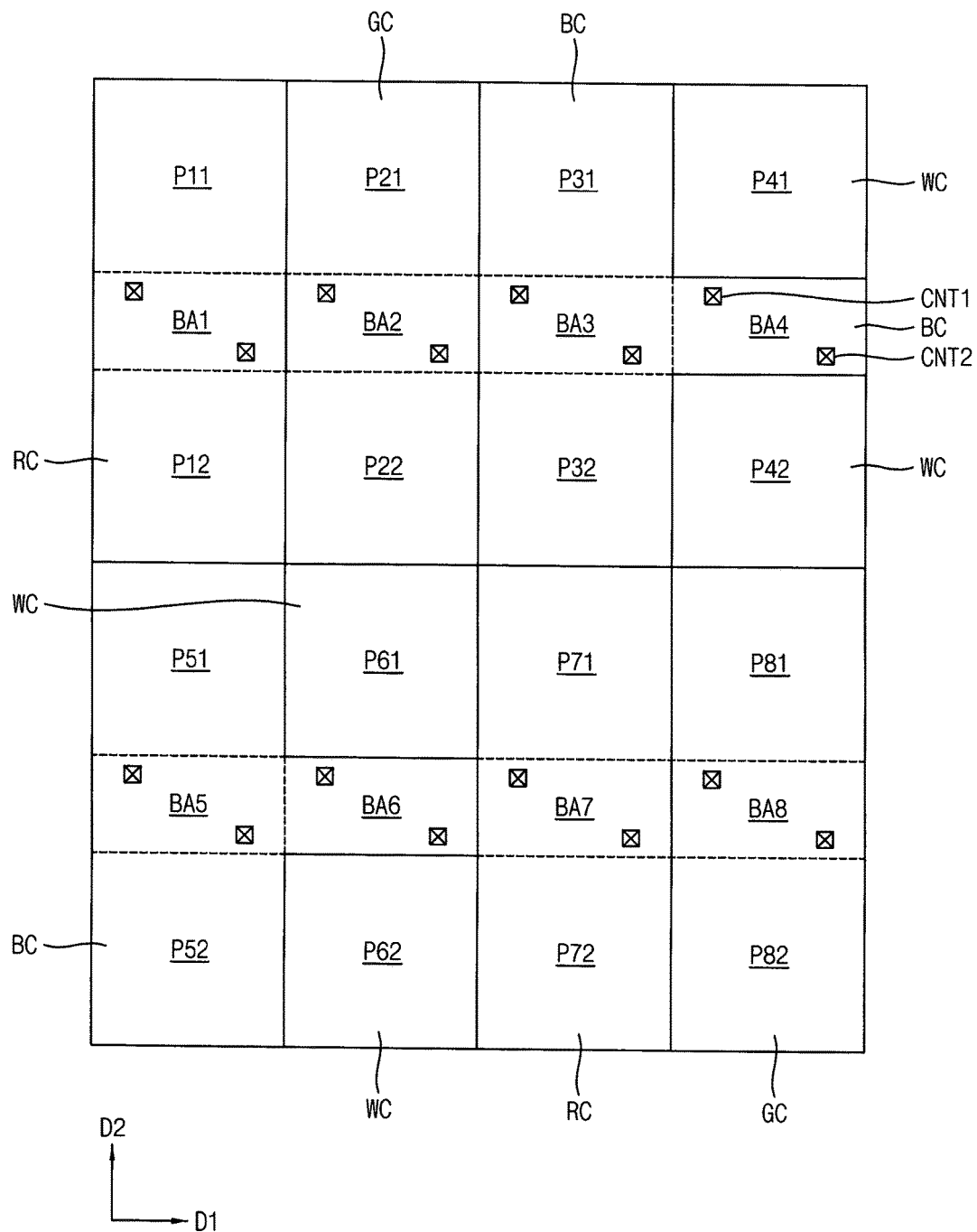
FIG. 2 is a plan view illustrating an exemplary embodiment of a color filter according to the invention.
Figure 3:
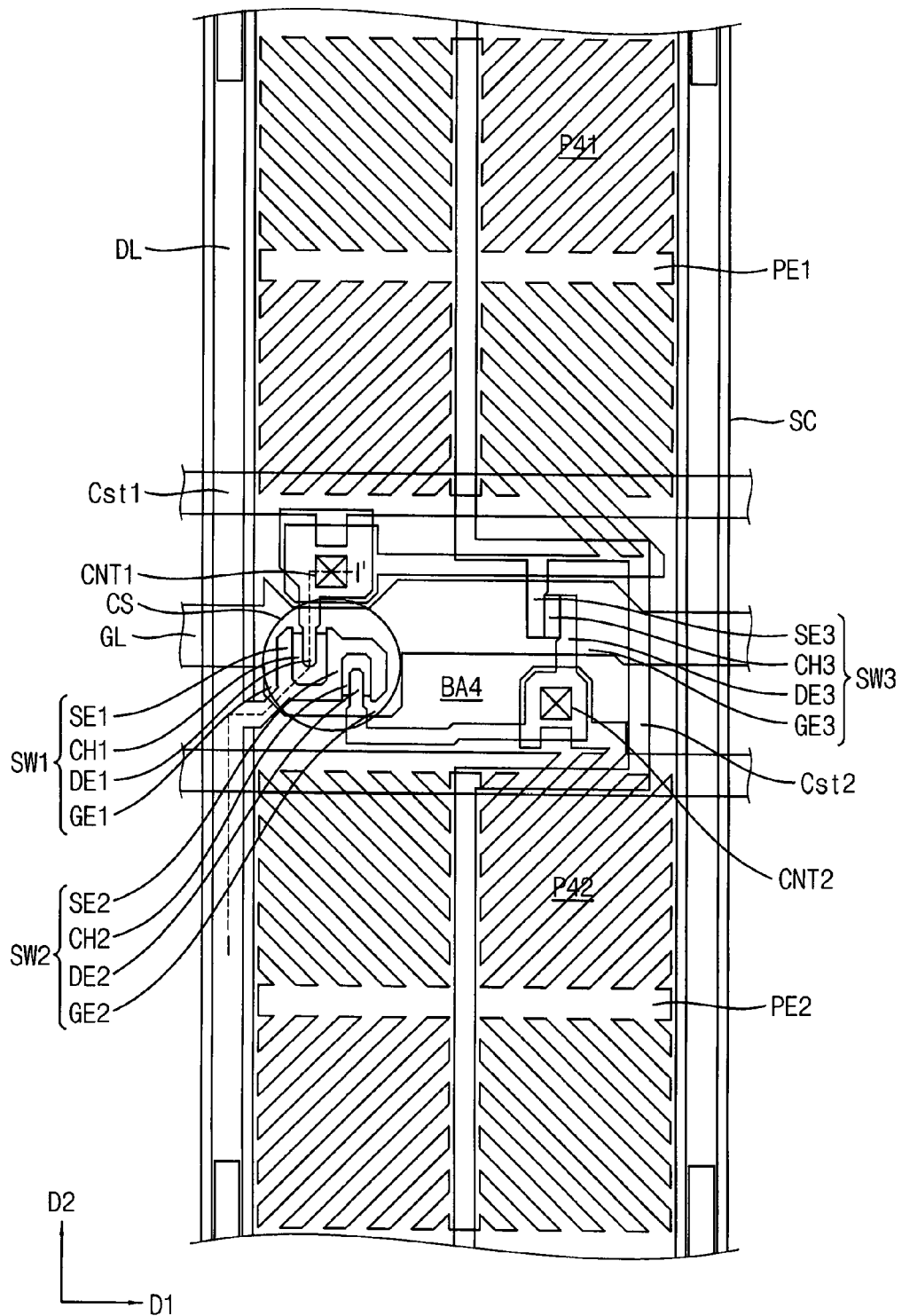
FIG. 3 is a plan view illustrating a unit pixel of the display substrate of FIG. 1.
Figure 4:
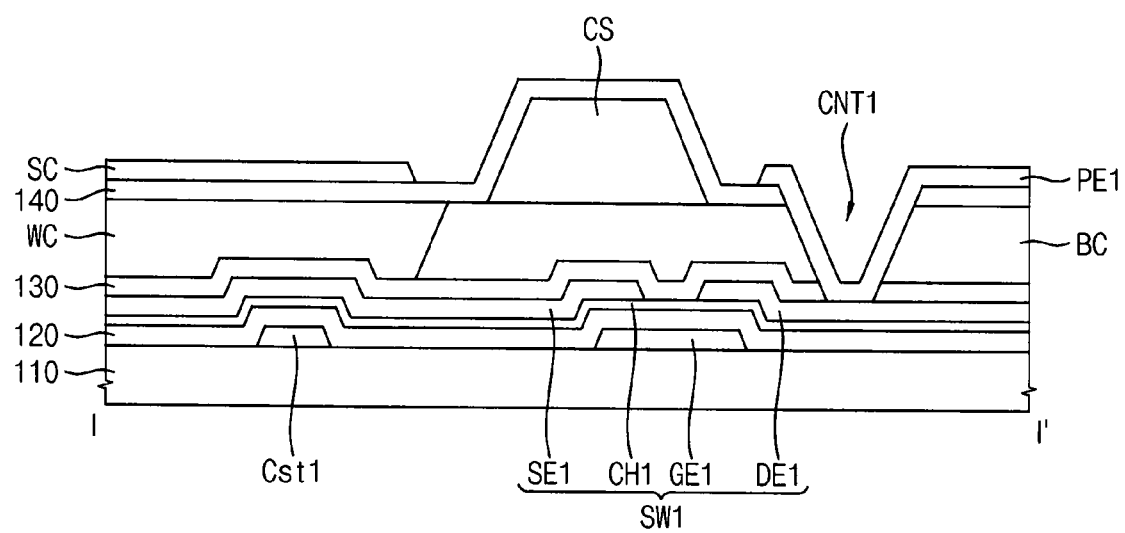
FIG. 4 is a cross-sectional view taken along line I-I' of FIG. 3.

FIG. 1 is a plan view illustrating a display substrate according to an exemplary embodiment of the invention. FIG. 2 is a plan view illustrating a color filter according to an exemplary embodiment of the invention. FIG. 3 is a plan view illustrating a unit pixel of the display substrate of FIG. 1. FIG. 4 is a cross-sectional view taken along line I-I' of FIG. 3.

Referring to FIGS. 1 to 4, a display substrate includes a gate line GL, a data line DL, a first storage line Cst1, a second storage line Cst2, a first switching element SW1, a second switching element SW2, a third switching element SW3, a high-pixel electrode PE1 and a low-pixel electrode PE2.

The gate line GL extends in a first direction D1. In an exemplary embodiment, the gate line GL may have a single layer structure including at least one of copper (Cu), silver (Ag), chrome (Cr), molybdenum (Mo), aluminum (Al), titanium (Ti), manganese (Mn) and a combination thereof, for example. In addition, the gate line GL may have a multi layer structure having a plurality of layers including materials different each other. In an exemplary embodiment, the gate line GL may include a copper layer and a titanium layer disposed on and/or under the copper layer, for example. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first storage line Cst1 extends in a first direction D1. The first storage line Cst1 overlaps with the high-pixel electrode PE1. The first storage line Cst1 is provided from the same layer as the gate line GL. Thus, the first storage line Cst1 may be disposed on the same layer as the gate line GL. In an exemplary embodiment, the first storage line Cst1 may have a single layer structure including at least one of copper (Cu), silver (Ag), chrome (Cr), molybdenum (Mo), aluminum (Al), titanium (Ti), manganese (Mn) and a combination thereof, for example. In addition, the first storage line Cst1 may have a multi layer structure having a plurality of layers including materials different each other. In an exemplary embodiment, the first storage line Cst1 may include a copper layer and a titanium layer disposed on and/or under the copper layer.

A first insulation layer 120 is disposed on the gate line GL and the first storage line Cst1. The first insulation layer 120 may include an inorganic material such as silicon oxide (SiOx) and/or silicon nitride (SiNx). In an exemplary embodiment, the first insulation layer 120 includes silicon oxide (SiOx), and may have a thickness of about 500 angstroms (Å), for example. In addition, the first insulation layer 120 may include a plurality of layers including different materials from each other.

The data line DL is disposed on first insulation layer 120. The data line DL extends in a second direction D2 crossing the first direction D1. The data line DL crosses the gate line GL. In an exemplary embodiment, the data line DL may have a single layer structure including at least one of copper (Cu), silver (Ag), chrome (Cr), molybdenum (Mo), aluminum (Al), titanium (Ti), manganese (Mn) and a combination thereof, for example. In another exemplary embodiment, the data line DL may have a multi layer structure having a plurality of layers including materials different each other. In an exemplary embodiment, the data line DL may include a copper layer and a titanium layer disposed on and/or under the copper layer, for example. The data line DL may be electrically connected to a first source electrode SE1 of the first switching element SW1, and a second source electrode SE2 of the second switching element SW2.

The second storage line Cst2 is provided from the same layer as the data line DL. Thus, the second storage line Cst2 may be disposed on the same layer as the data line DL. In an exemplary embodiment, the second storage line Cst2 may have a single layer structure including one of copper (Cu), silver (Ag), chrome (Cr), molybdenum (Mo), aluminum (Al), titanium (Ti), manganese (Mn) and a combination thereof, for example. In another exemplary embodiment, the second storage line Cst2 may have a multi layer structure having a plurality of layers including materials different each other. In an exemplary embodiment, the second storage line Cst2 may include a copper layer and a titanium layer disposed on and/or under the copper layer, for example. The second storage line Cst2 may be electrically connected to a third source electrode SE3 of the third switching element SW3.

A second insulation layer 130 is formed on the data line DL and the second storage line Cst2. In an exemplary embodiment, the second insulation layer 130 may include an inorganic material such as silicon oxide (SiOx) and/or silicon nitride (SiNx), for example. In an exemplary embodiment, the second insulation layer 130 includes silicon oxide (SiOx), and may have a thickness of about 500 Å. In addition, the second insulation layer 130 may include a plurality of layers including different materials from each other.

An organic layer is disposed on the second insulation layer 130. The organic layer planarizes an upper surface of the substrate so that problems due to the step such as disconnection of a signal line may be prevented. In an exemplary embodiment, the organic layer may be an insulation layer including an organic material, for example. In an exemplary embodiment, the organic layer may a color filter layer, for example.

When the organic layer is a color filter layer, the color filter layer may be a color filter layer having a red color filter RC, a green color filter GC, a blue color filter BC or a white color filter WC. In an exemplary embodiment, the red color filter RC, the green color filter GC, the blue color filter BC and the white color filter WC may be stacked sequentially, for example.

A display substrate according to an exemplary embodiment of the invention may include a plurality of sub-pixels. The red color filter RC, the green color filter GC, the blue color filter BC and the white color filter WC may be disposed on sub-pixel respectively.

The sub-pixel of the display substrate may include a light-blocking area, a high-pixel area disposed adjacent to the light-blocking area and a low-pixel area disposed opposite to the high-pixel area with reference to the light-blocking area. In an exemplary embodiment, the red color filter RC, the green color filter GC, the blue color filter BC and the white color filter WC may be disposed on a light-blocking area, a high-pixel area and a low-pixel area of the sub-pixel respectively.

The red color filter RC is disposed on a first sub-pixel. The first sub-pixel includes a first high-pixel area P11, a first low-pixel area P12 and a first light-blocking area BA1. The first high-pixel area P11 is disposed adjacent to the first light-blocking area BA1. The first low-pixel area P12 is disposed opposite to the first high-pixel area P11 with reference to the first light-blocking area BA1. The high-pixel electrode PE1 may be disposed on the first high-pixel area P11. The low-pixel electrode PE2 may be disposed on the first low-pixel area P12. The first switching element SW1, the second switching element SW2 and the third switching element SW3 may be disposed on the first light-blocking area BA1. In addition, contact holes exposing a portion of the first switching element SW1, the second switching element SW2 and the third switching element SW3 may be defined in the first light-blocking area BA1.

The green color filter GC is disposed on a second sub-pixel. The second sub-pixel includes a second high-pixel area P21, a second low-pixel area P22 and a second light-blocking area BA2. The second high-pixel area P21 is disposed adjacent to the second light-blocking area BA2. The second low-pixel area P22 is disposed opposite to the second high-pixel area P21 with reference to the second light-blocking area BA2. The high-pixel electrode PE1 may be disposed on the second high-pixel area P21. The low-pixel electrode PE2 may be disposed on the second low-pixel area P22. The first switching element SW1, the second switching element SW2 and the third switching element SW3 may be disposed on the second light-blocking area BA2. In addition, contact holes exposing a portion of the first switching element SW1, the second switching element SW2 and the third switching element SW3 may be defined in the second light-blocking area BA2.

The blue color filter BC is disposed on a third sub-pixel and a light-blocking area of a fourth sub-pixel. The third sub-pixel includes a third high-pixel area P31, a third low-pixel area P32 and a fourth light-blocking area BA4. The third high-pixel area P31 is disposed adjacent to the third light-blocking area BA3. The third low-pixel area P32 is disposed opposite to the third high-pixel area P31 with reference to the third light-blocking area BA3. The high-pixel electrode PE1 may be disposed on the third high-pixel area P31. The low-pixel electrode PE2 may be disposed on the third low-pixel area P32. The first switching element SW1, the second switching element SW2 and the third switching element SW3 may be disposed on the third light-blocking area BA3. In addition, contact holes exposing a portion of the first switching element SW1, the second switching element SW2 and the third switching element SW3 may be defined in the third light-blocking area BA3.

The white color filter WC is disposed on a fourth high-pixel area P41 of a fourth sub-pixel and a fourth low-pixel area P42 of the fourth sub-pixel. The fourth sub-pixel includes a fourth high-pixel area P41, a fourth low-pixel area P42 and a fourth light-blocking area BA4. The fourth high-pixel area P41 is disposed adjacent to the fourth light-blocking area BA4. The fourth low-pixel area P42 is disposed opposite to the fourth high-pixel area P41 with reference to the fourth light-blocking area BA4. The high-pixel electrode PE1 may be disposed on the fourth high-pixel area P41. The low-pixel electrode PE2 may be disposed on the fourth low-pixel area P42. The first switching element SW1, the second switching element SW2 and the third switching element SW3 may be disposed on the fourth light-blocking area BA4. In addition, contact holes exposing a portion of the first switching element SW1, the second switching element SW2 and the third switching element SW3 may be defined in the fourth light-blocking area BA4.

A column spacer CS is disposed on the organic layer. The column spacer CS maintains a distance between the display substrate and an opposing substrate opposing the display substrate. The column spacer CS may include material having elasticity with respect to an external pressure. In an exemplary embodiment, the column spacer CS may include an acrylic resin, for example. In an exemplary embodiment, the column spacer CS may include the same material as that of the white color filter WC, for example. In an exemplary embodiment, the column spacer CS may be provided by the same process as the white color filter WC, for example.

The column spacer CS may be overlapped with the first switching element SW1. In the illustrated exemplary embodiment, one column spacer CS is disposed on the plurality of sub-pixels. However, the invention is not limited thereto. In an alternative exemplary embodiment, the number of the column spacers CS may be changed according to a size of a display substrate.

A third insulation layer 140 is disposed on the column spacer CS. In an exemplary embodiment, the third insulation layer 140 may include an inorganic material such as silicon oxide (SiOx) and/or silicon nitride (SiNx). In an exemplary embodiment, the third insulation layer 140 includes silicon oxide (SiOx), and may have a thickness of about 500 Å, for example. In an exemplary embodiment, the third insulation layer 140 may include a plurality of layers including different materials from each other.

A shielding electrode SC, a high-pixel electrode PE1 and a low-pixel electrode PE2 is disposed on the third insulation layer 140.

In an exemplary embodiment, the shielding electrode SC may include a transparent conductive material, such as indium tin oxide ("ITO") and indium zinc oxide ("IZO"). In an exemplary embodiment, the shielding electrode SC may include titanium (Ti) and/or molybdenum titanium (MoTi), for example.

A display panel according to another exemplary embodiment may include a display substrate, a facing substrate facing the display substrate and liquid crystal layer interposed between the display substrate and the facing substrate. The facing substrate may include a common electrode. The common electrode is disposed on an entirely region of the facing substrate and may include a transparent conductive material. In addition, a common voltage is applied to the common electrode. The common voltage may be applied to the shielding electrode SC. When the common voltage is applied to the shielding electrode SC, molecules of the liquid crystal disposed on the shielding electrode SC are aligned in a vertical direction. Thus, a direction of the molecules of the liquid crystal may be equal to a direction of a polarizer, so that a region on the shielding electrode SC may be black. Therefore, a light may be blocked without a black matrix.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

The high-pixel electrode PE1 is disposed adjacent to the gate line GL in the second direction D2, and between the first data line DL1 and the second data line DL2. The high-pixel electrode PE1 is electrically connected to a first drain electrode DE1 of the first switching element SW1 through a first contact hole CNT1.

The low-pixel electrode PE2 is disposed opposite to the high-pixel electrode PE1 with reference to the gate line GL, and between the first data line DL1 and the second data line DL2. The low-pixel electrode PE2 is electrically connected to the second drain electrode DE2 of the second switching element SW2 and the third drain electrode DE3 of the third switching element SW3 through a second contact hole CNT2.

A first voltage may be applied to the high-pixel electrode PE1. A second voltage different from the first voltage may be applied to the low-pixel electrode PE2. In an exemplary embodiment, the first voltage may be higher than the second voltage so that a portion of the pixel corresponding to the high-pixel electrode PE1 may be driven as a high pixel, and another portion of the pixel corresponding to the low-pixel electrode PE2 may be driven as a low pixel.

The second storage line Cst2 may be provided from the same layer as the data line DL. Thus, the second storage line Cst2 may be disposed in the same layer as the data line DL. In an exemplary embodiment, the second storage line Cst2 may have a single layer structure including at least one of copper (Cu), silver (Ag), chrome (Cr), molybdenum (Mo), aluminum (Al), titanium (Ti), manganese (Mn) and a combination thereof, for example. In another exemplary embodiment, the second storage line Cst2 may have a multi layer structure having a plurality of layers including materials different each other. In an exemplary embodiment, the second storage line Cst2 may include a copper layer and a titanium layer disposed on and/or under the copper layer, for example. The second storage line Cst2 is electrically connected to a third source electrode SE3 of the third switching element SW3.

The first switching element SW1 includes the first gate electrode GE1, the first source electrode SE1, the first drain electrode DE1 and a first channel portion CH1 connecting the first source electrode SE1 to the first drain electrode DE1.

In an exemplary embodiment, the first channel portion CH1 may include a semiconductor layer including amorphous silicon (a-Si:H) and an ohmic contact layer including n+ amorphous silicon (n+ a-Si:H), for example. In an exemplary embodiment, the first channel portion CH1 may include an oxide semiconductor. In an exemplary embodiment, the oxide semiconductor may include an amorphous oxide including at least one of indium (In), zinc (Zn), gallium (Ga), tin (Sn) and hafnium (Hf), for example.

The second switching element SW2 includes the second gate electrode GE2, the second source electrode SE2, the second drain electrode DE2 and a second channel portion CH2 connecting the second source electrode SE2 to the second drain electrode DE2.

In an exemplary embodiment, the second channel portion CH2 may include a semiconductor layer including amorphous silicon (a-Si:H) and an ohmic contact layer including n+ amorphous silicon (n+ a-Si:H), for example. In an exemplary embodiment, the second channel portion CH2 may include an oxide semiconductor. In an exemplary embodiment, the oxide semiconductor may include an amorphous oxide including at least one of indium (In), zinc (Zn), gallium (Ga), tin (Sn) and hafnium (Hf), for example.

The third switching element SW3 includes the third gate electrode GE3, the third source electrode SE3, the third drain electrode DE3 and a third channel portion CH3 connecting the third source electrode SE3 to the third drain electrode DE3.

In an exemplary embodiment, the third channel portion CH3 may include a semiconductor layer including amorphous silicon (a-Si:H) and an ohmic contact layer including n+ amorphous silicon (n+ a-Si:H), for example. In an exemplary embodiment, the third channel portion CH3 may include an oxide semiconductor. In an exemplary embodiment, the oxide semiconductor may include an amorphous oxide including at least one of indium (In), zinc (Zn), gallium (Ga), tin (Sn) and hafnium (Hf), for example.

In the exemplary embodiment, the white color filter WC includes the same material as that of the column spacer CS. That is, the white color filter WC and the column spacer CS include material having elasticity with respect to an external pressure. Therefore, it is difficult to define a contact hole in the white color filter WC, and thus defects of a display apparatus may be occurred.

However, in the illustrated exemplary embodiment, the blue color filter BC is disposed on the light-blocking area of a sub-pixel on which the white color filter WC is disposed. That is, the blue color filter BC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

FIGS. 5 to 10 are cross-sectional views illustrating a method of manufacturing the display substrate of FIG. 3.

Figure 5:
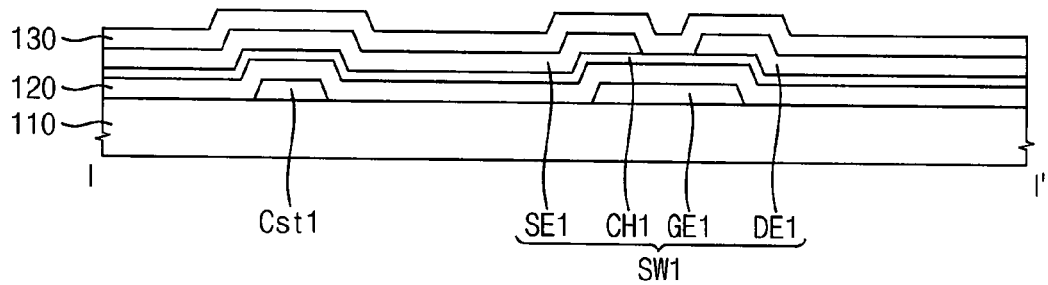
FIGS. 5 to 10 are cross-sectional views illustrating a method of manufacturing the display substrate of FIG. 3.

Referring to FIG. 5, a gate metal layer is disposed on a base substrate 110, and then the gate metal layer may be partially etched by a photolithography process or an etching process using an additional etching mask, for example. Hence, the gate pattern is provided. The gate pattern includes a first storage line Cst1, a gate line GL (refer to FIG. 3), a first gate electrode GE1, a second gate electrode GE2 (refer to FIG. 3) and a third gate electrode GE3 (refer to FIG. 3).

The base substrate 110 may include a material which has relatively high transmittance, thermal resistance, and chemical resistance. In an exemplary embodiment, the base substrate 110 may include any one of glass, polyethylenenaphthalate, polyethylene terephthalate, polyacryl and a combination thereof, for example.

The gate pattern may include a metal, a metal alloy, a metal nitride, a conductive metal oxide, a transparent conductive material, and etc. In an exemplary embodiment, the gate pattern may include copper (Cu) which is opaque, for example.

The first insulation layer 120 is disposed on the base substrate 110 on which the gate pattern is provided. The first insulation layer 120 is disposed on the gate pattern. The first insulation layer 120 covers and insulates the first storage line Cst1, the gate line GL (refer to FIG. 3), the first gate electrode GE1, the second gate electrode GE2 (refer to FIG. 3) and the third gate electrode GE3 (refer to FIG. 3).

Thereafter, a semiconductor layer and a data metal layer are disposed on the base substrate 110 on which the first insulation layer 120 is provided.

In an exemplary embodiment, the semiconductor layer may include a silicon semiconductor layer including amorphous silicon (a-Si:H) and an ohmic contact layer including n+ amorphous silicon (n+ a-Si:H), for example. In an exemplary embodiment, the semiconductor layer may include an oxide semiconductor. In an exemplary embodiment, the oxide semiconductor may include an amorphous oxide including at least one of indium (In), zinc (Zn), gallium (Ga), tin (Sn) and hafnium (Hf), for example.

In an exemplary embodiment, the data metal layer may have a single layer structure including at least one of copper (Cu), silver (Ag), chrome (Cr), molybdenum (Mo), aluminum (Al), titanium (Ti), manganese (Mn) and a combination thereof. In addition, the data metal layer may have a multi layer structure having a plurality of layers including materials different each other. In an exemplary embodiment, the data metal layer may include a copper layer and a titanium layer disposed on and/or under the copper layer.

Thereafter, the semiconductor layer and the data metal layer may be partially etched by a photolithography process or an etching process using an additional etching mask, for example Hence, a channel layer including a first channel portion CH1, a second channel portion CH2 (refer to FIG. 3) and a third channel portion CH3 (refer to FIG. 3), and data pattern are provided. In an exemplary embodiment, the channel layer may include a silicon semiconductor layer including amorphous silicon (a-Si:H) and an ohmic contact layer including n+ amorphous silicon (n+ a-Si:H), for example. In an exemplary embodiment, the channel layer may include an oxide semiconductor, for example. In an exemplary embodiment, the oxide semiconductor may include an amorphous oxide including at least one of indium (In), zinc (Zn), gallium (Ga), tin (Sn) and hafnium (Hf), for example.

The data pattern includes a first drain electrode DE1, a first source electrode SE1, a second source electrode SE2 (refer to FIG. 3), a second drain electrode DE2 (refer to FIG.

3), a third source electrode SE3 (refer to FIG. 3), a third drain electrode DE3 (refer to FIG. 3), a first data line DL1 (refer to FIG. 1) and a second data line DL2 (refer to FIG. 1). In an exemplary embodiment, the semiconductor layer and the data metal layer are patterned at the same time, and then a portion of the metal layer, which is patterned, is removed. Hence, the first source electrode SE1 and the first drain electrode DE1 spaced apart from the first source electrode SE1. In an exemplary embodiment, the second source electrode SE2 (refer to FIG. 3) and the second drain electrode DE2 (refer to FIG. 3) spaced apart from the second source electrode SE2 (refer to FIG. 3) may be provided by removing a portion of the patterned metal layer. In addition, the third source electrode SE3 (refer to FIG. 3) and the third drain electrode DE3 (refer to FIG. 3) spaced apart from the third source electrode SE3 (refer to FIG. 3) may be provided by removing a portion of the patterned metal layer.

A second insulation layer 130 is disposed on the base substrate 110 on which the data pattern and the channel layer are provided.

In an exemplary embodiment, the second insulation layer 130 may be provided by a spin coating process, a printing process, a sputtering process, a chemical vapor deposition ("CVD") process, an atomic layer deposition ("ALD") process, a plasma-enhanced chemical vapor deposition ("PECVD") process, an high-density plasma chemical vapor deposition ("HDP-CVD") process or a vacuum evaporation process in accordance with ingredients included in the second insulation layer 130, for example. The second insulation layer 130 is disposed on the data pattern. The second insulation layer 130 covers and insulates the first drain electrode DE1, the first source electrode SE1, the second source electrode SE2 (refer to FIG. 3), the second drain electrode DE2 (refer to FIG. 3), the third source electrode SE3 (refer to FIG. 3), the third drain electrode DE3 (refer to FIG. 3) and the data line DL (refer to FIG. 3).

Figure 6:
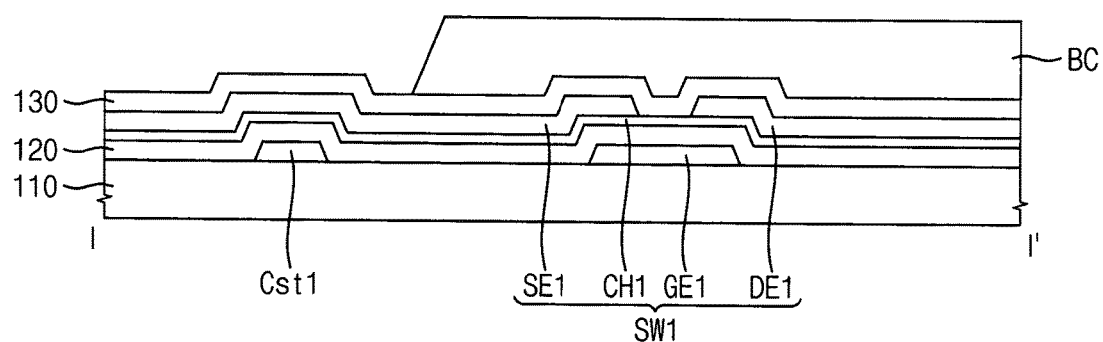

Referring to FIG. 6, an organic layer is disposed on the base substrate 110 on which the second insulation layer 130 is disposed. The organic layer may be a color filter layer. A photoresist is disposed on the second insulation layer 130, and then the photoresist is exposed using a mask, and then the photoresist is developed using a developing solution. Hence, the organic layer may be provided.

The organic layer is disposed on the second insulation layer 130. When the organic layer is color filter layer, the color filter layer supplies colors to the light passing through the liquid crystal layer. When the organic layer is a color filter layer, the color filter layer may have a red color filter RC, a green color filter GC or a blue color filter BC. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels. In addition, the red color filter RC, the green color filter GC and the blue color filter BC may be stacked sequentially. However, the invention is not limited thereto. In an alternative exemplary embodiment, a stacking order of the color filters may be changed. In an exemplary embodiment, the green color filter GC, the red color filter RC and the blue color filter BC may be stacked sequentially.

Figure 7:
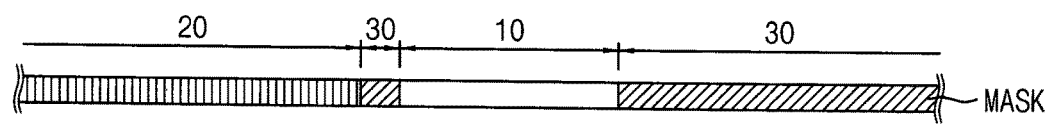
Figure 7:
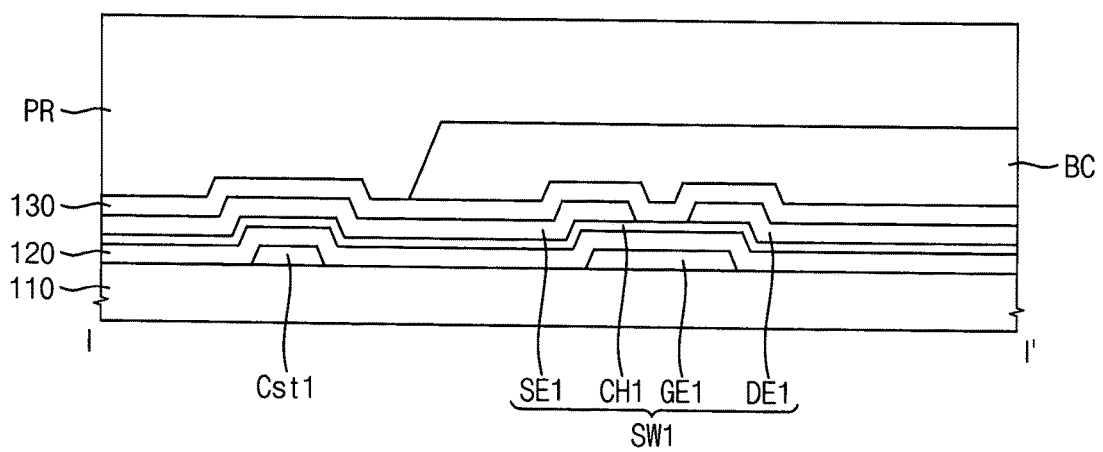

Referring to FIG. 7, a photoresist PR including a transparent material is disposed on the base substrate 110 on which the blue color filter BC is disposed. In an exemplary embodiment, the photoresist PR may be a negative photosensitive material, for example.

Thereafter, an exposing mask including a transmitting part 10, a shielding part 30, and a diffracting part 20 is arranged on the base substrate 110. The exposing mask includes a half-tone mask having a half-tone layer provided on an area corresponding to the diffracting part 20. In an exemplary embodiment, the exposing mask may include a slit mask including a metal layer having a minute pattern provided on an area corresponding to the diffracting part 20.

When light is irradiated into the exposing mask, the transmitting part 10 transmits the light and the shielding part 30 shields the light. The diffracting part 20 diffracts the light so that some of the light is transmitted through the exposing mask.

When the photoresist PR exposed to the light through the exposing mask is developed, a portion of the photoresist PR corresponding to the shielding part is dissolved to be removed and a portion of the photoresist PR corresponding to the transmitting part 10 remains with a thickness substantially the same as that of the photoresist PR before the photoresist PR is developed. A portion of the photoresist PR remains with a thickness thinner than that of the photoresist PR before the photoresist PR is developed.

Figure 8:
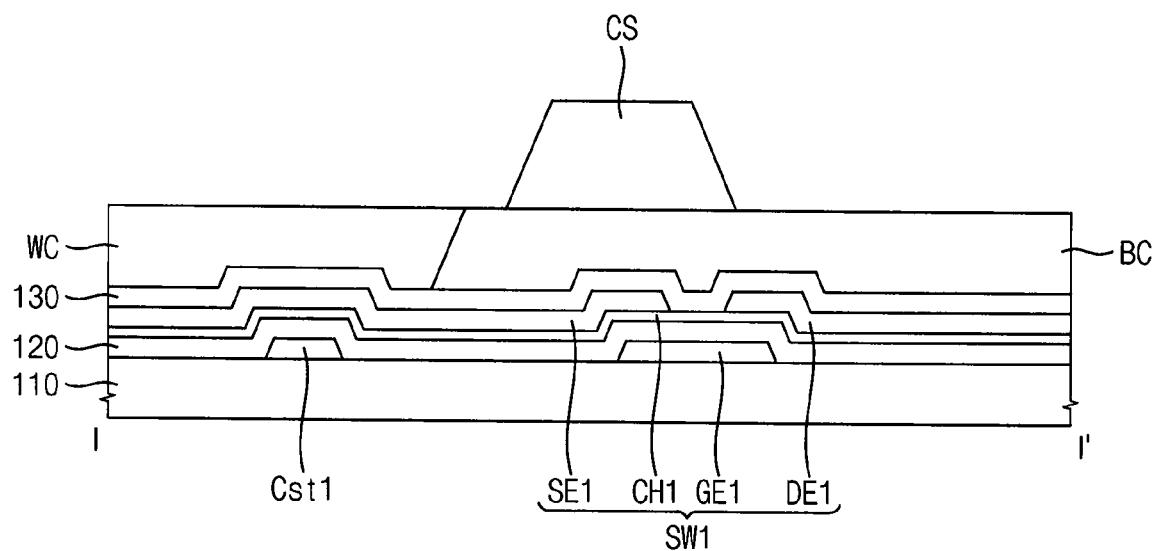

Referring to FIG. 8, the white color filter WC and the column spacer CS are provided.

The column spacer CS maintains a distance between the display substrate and an opposing substrate opposing the display substrate. The column spacer CS may include material having elasticity with respect to an external pressure. In an exemplary embodiment, the column spacer CS may include a transparent material. In an exemplary embodiment, the column spacer CS may include an acrylic resin, for example. In an exemplary embodiment, the column spacer CS may include the same material as that of the white color filter WC. In an exemplary embodiment, the column spacer CS may be provided by the same process as the white color filter WC.

Figure 9:
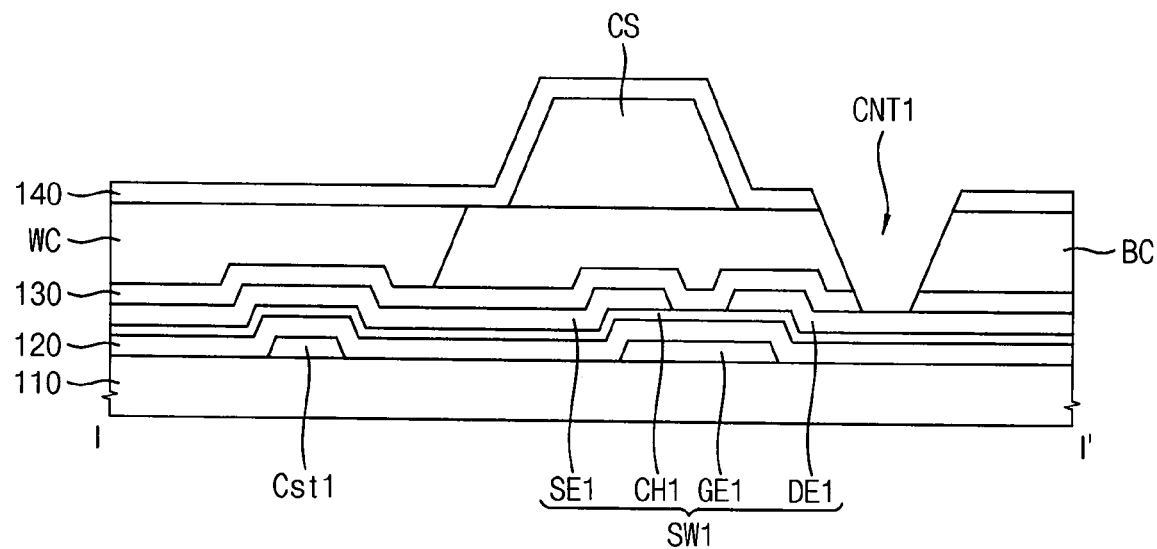

Referring to FIG. 9, a third insulation layer 140 is disposed on the base substrate 110 on which the white color filter WC and the column spacer CS are disposed. Thereafter, a first contact hole CNT1 passing the third insulation layer 140 and the organic layer is defined.

In an exemplary embodiment, the third insulation layer 140 may be provided by a spin coating process, a printing process, a sputtering process, a CVD process, an ALD process, a PECVD process, an HDP-CVD process or a vacuum evaporation process in accordance with ingredients included in the third insulation layer 140, for example. The third insulation layer 140 covers and insulates the organic layer and the column spacer CS.

Thereafter, a first contact hole CNT1 passing the third insulation layer 140 and the organic layer is defined.

In the exemplary embodiment, the white color filter WC includes the same material as that of the column spacer CS. That is, the white color filter WC and the column spacer CS include material having elasticity with respect to an external pressure. Therefore, it is difficult to define a contact hole in the white color filter WC, and thus defects of a display apparatus may be occurred.

However, in the illustrated exemplary embodiment, the blue color filter BC is disposed on the light-blocking area of a sub-pixel on which the white color filter WC is disposed. That is, the blue color filter BC is disposed on the fourth light-blocking area BA4 (refer to FIG. 2). Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

Figure 10:
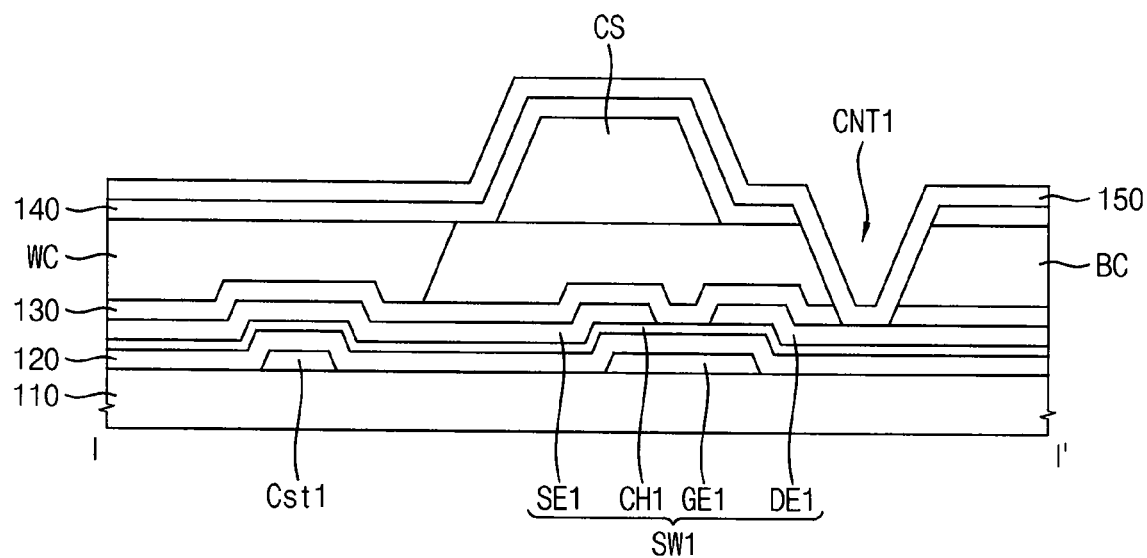

Referring to FIG. 10, a transparent conductive layer 150 is disposed on the base substrate 110 in which the first contact hole CNT1 is defined.

In an exemplary embodiment, the transparent conductive layer 150 may include a transparent conductive material, such as ITO and IZO. In an exemplary embodiment, the transparent conductive layer 150 may include titanium (Ti) and/or molybdenum titanium (MoTi), for example.

Referring to FIG. 4, the transparent conductive layer 150 is patterned to provide a shielding electrode SC and a pixel electrode. The pixel electrode may include a high-pixel electrode PE1 and a low-pixel electrode PE2 (refer to FIG. 3).

In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

According to the illustrated exemplary embodiment, the blue color filter BC is disposed on the light-blocking area of a sub-pixel on which the white color filter WC is disposed. That is, the blue color filter BC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

Figure 11:
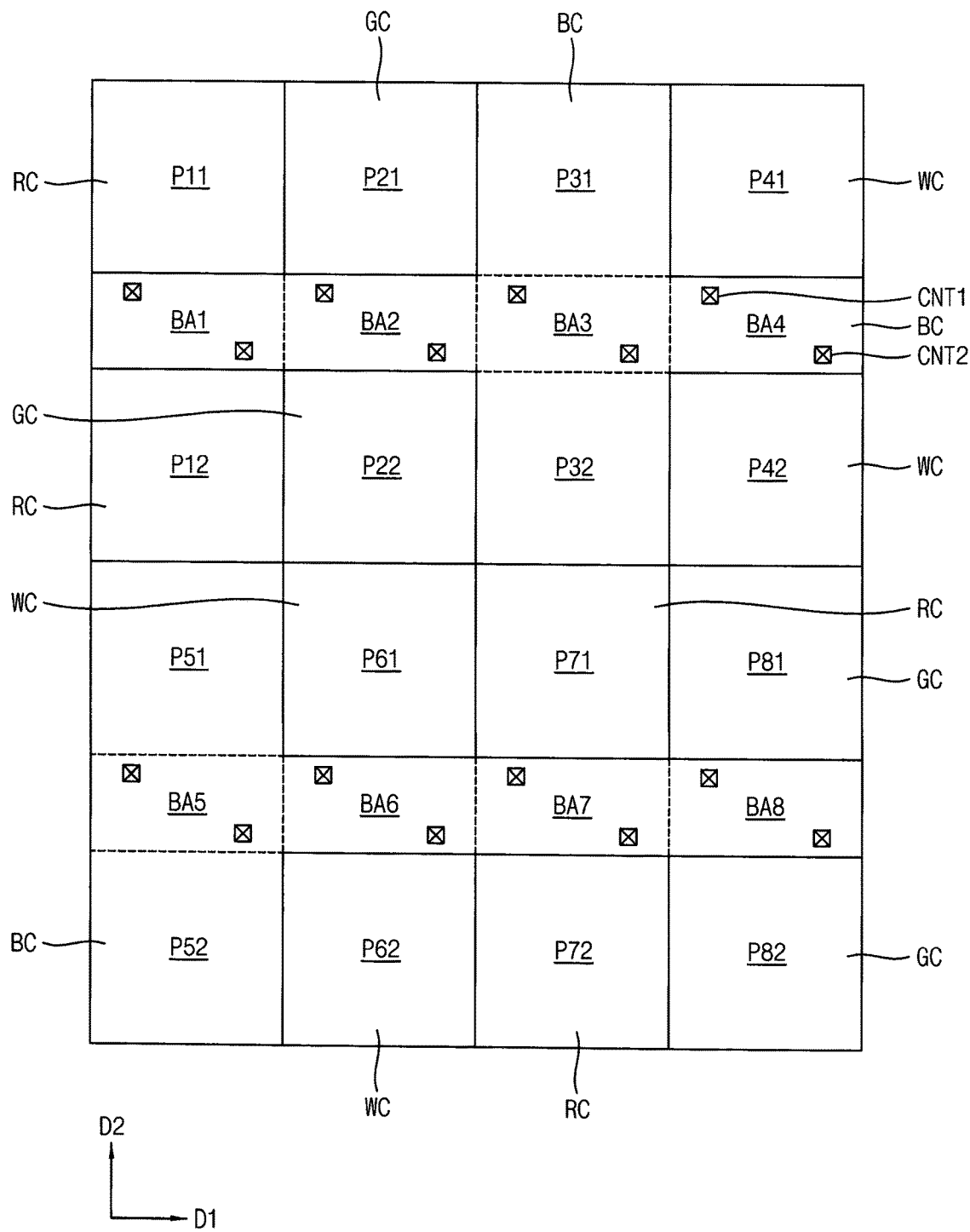
FIG. 11 is a plan view illustrating an exemplary embodiment of a color filter according to the invention.
Figure 12:
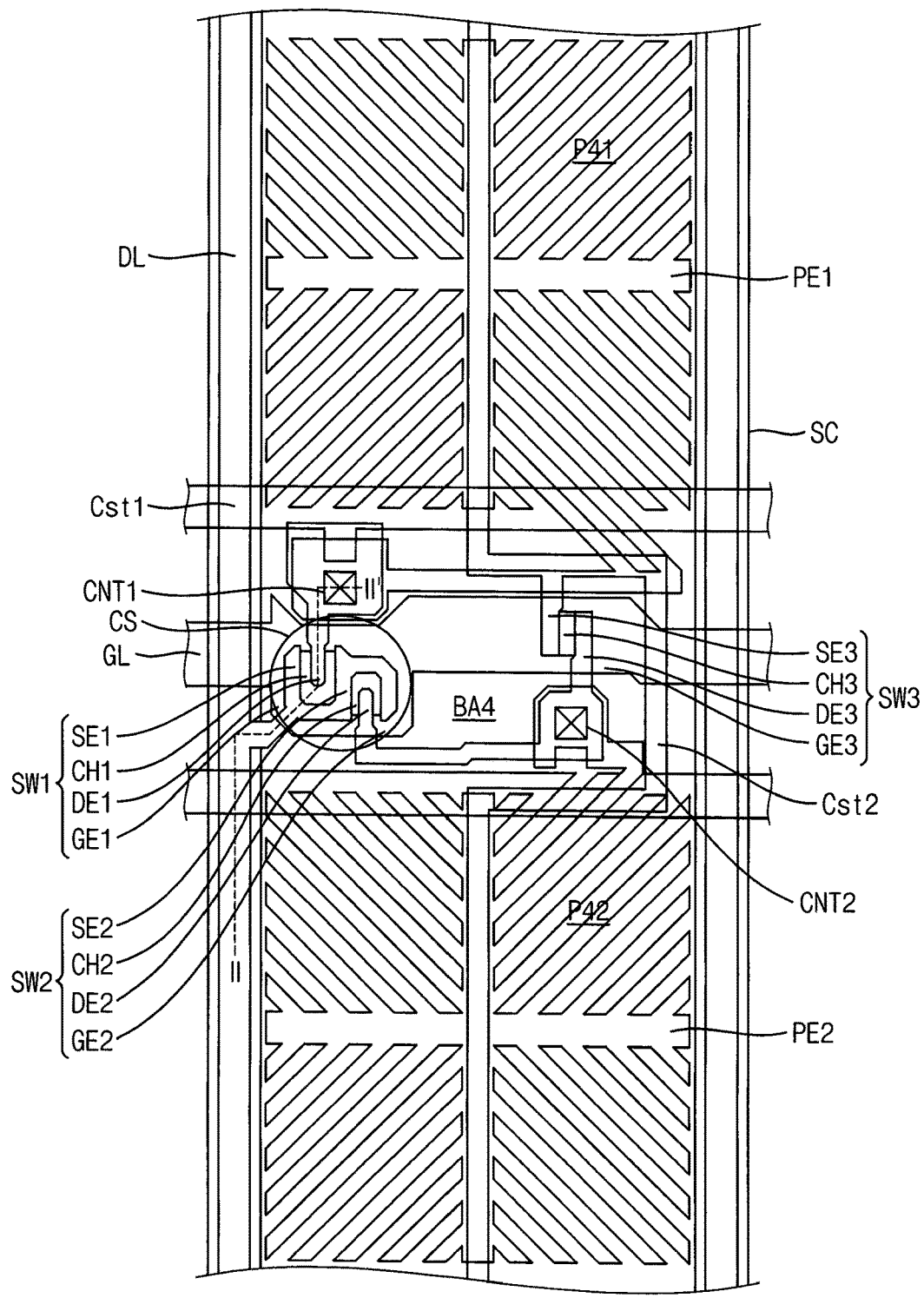
FIG. 12 is a plan view illustrating an exemplary embodiment of a unit pixel according to the invention.
Figure 13:
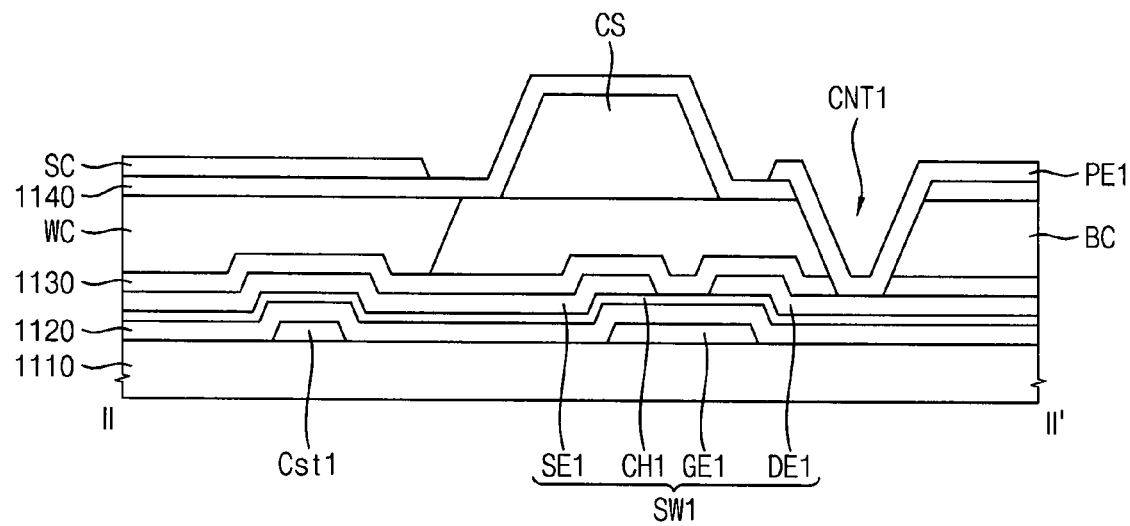
FIG. 13 is a cross-sectional view taken along line II-IF of FIG. 12.

FIG. 11 is a plan view illustrating a color filter according to an exemplary embodiment of the invention. FIG. 12 is a plan view illustrating a unit pixel according to an exemplary embodiment of the invention. FIG. 13 is a cross-sectional view taken along line II-IF of FIG. 12.

The display substrate according to the exemplary embodiment is substantially same as the display substrate of the FIGS. 1 to 10 except for a red color filter RC, a green color filter GC, a blue color filter BC and a white color filter WC, and thus same reference numerals are used for same elements and repetitive explanation will be omitted.

Referring to FIGS. 1, 11 to 13, a display substrate includes a gate line GL, a data line DL, a first storage line Cst1, a second storage line Cst2, a first switching element SW1, a second switching element SW2, a third switching element SW3, a high-pixel electrode PE1 and a low-pixel electrode PE2.

An organic layer is disposed on the second insulation layer 1130. The organic layer planarizes an upper surface of the substrate so that problems due to the step such as disconnection of a signal line may be prevented. In an exemplary embodiment, the organic layer may be an insulation layer including an organic material, for example. In an exemplary embodiment, the organic layer may a color filter layer, for example.

When the organic layer is a color filter layer, the color filter layer may be a color filter layer having a red color filter RC, a green color filter GC, a blue color filter BC or a white color filter WC. In an exemplary embodiment, the red color filter RC, the green color filter GC, the blue color filter BC and the white color filter WC may be stacked sequentially.

A display substrate according to an exemplary embodiment of the invention may include a plurality of sub-pixels. The red color filter RC, the green color filter GC, the blue color filter BC and the white color filter WC may be disposed on sub-pixel respectively.

The sub-pixel of the display substrate may include a light-blocking area, a high-pixel area disposed adjacent to the light-blocking area and a low-pixel area disposed opposite to the high-pixel area with reference to the light-blocking area. The red color filter RC, the green color filter GC, the blue color filter BC and the white color filter WC may be disposed on a light-blocking area, a high-pixel area and a low-pixel area of the sub-pixel respectively.

The red color filter RC is disposed on a first high-pixel area P11 of a first sub-pixel and a first low-pixel area P12 of the first sub-pixel. The first sub-pixel includes a first high-pixel area P11, a first low-pixel area P12 and a first light-blocking area BA1. The blue color filter BC is disposed on the first light-blocking area BA1. The first high-pixel area P11 is disposed adjacent to the first light-blocking area BA1. The first low-pixel area P12 is disposed opposite to the first high-pixel area P11 with reference to the first light-blocking area BA1. The high-pixel electrode PE1 may be disposed on the first high-pixel area P11. The low-pixel electrode PE2 may be disposed on the first low-pixel area P12. The first switching element SW1, the second switching element SW2 and the third switching element SW3 may be disposed on the first light-blocking area BA1. In addition, contact holes exposing a portion of the first switching element SW1, the second switching element SW2 and the third switching element SW3 may be disposed on the first light-blocking area BA1.

The green color filter GC is disposed on a second high-pixel area P21 of a second sub-pixel and a second low-pixel area P22 of the second sub-pixel. The second sub-pixel includes a second high-pixel area P21, a second low-pixel area P22 and a second light-blocking area BA2. The blue color filter BC is disposed on the second light-blocking area BA2. The second high-pixel area P21 is disposed adjacent to the second light-blocking area BA2. The second low-pixel area P22 is disposed opposite to the second high-pixel area P21 with reference to the second light-blocking area BA2. The high-pixel electrode PE1 may be disposed on the second high-pixel area P21. The low-pixel electrode PE2 may be disposed on the second low-pixel area P22. The first switching element SW1, the second switching element SW2 and the third switching element SW3 may be disposed on the second light-blocking area BA2. In addition, contact holes exposing a portion of the first switching element SW1, the second switching element SW2 and the third switching element SW3 may be defined in the second light-blocking area BA2.

The blue color filter BC is disposed on a third sub-pixel, the first light-blocking area BA1, the second light-blocking area BA2 and the fourth light-blocking area BA4. The third sub-pixel includes a third high-pixel area P31, a third low-pixel area P32 and a third light-blocking area BA3. The third high-pixel area P31 is disposed adjacent to the third light-blocking area BA3. The third low-pixel area P32 is disposed opposite to the third high-pixel area P31 with reference to the third light-blocking area BA3. The high-pixel electrode PE1 may be disposed on the third high-pixel area P31. The low-pixel electrode PE2 may be disposed on the third low-pixel area P32. The first switching element SW1, the second switching element SW2 and the third switching element SW3 may be disposed on the third light-blocking area BA3. In addition, contact holes exposing a portion of the first switching element SW1, the second switching element SW2 and the third switching element SW3 may be defined in the third light-blocking area BA3.

The white color filter WC is disposed on a fourth high-pixel area P41 of a fourth sub-pixel and a fourth low-pixel area P42 of the fourth sub-pixel. The fourth sub-pixel includes a fourth high-pixel area P41, a fourth low-pixel area P42 and a fourth light-blocking area BA4. The blue color filter BC is disposed on the fourth light-blocking area BA4. The fourth high-pixel area P41 is disposed adjacent to the fourth light-blocking area BA4. The fourth low-pixel area P42 is disposed opposite to the fourth high-pixel area P41 with reference to the fourth light-blocking area BA4. The high-pixel electrode PE1 may be disposed on the fourth high-pixel area P41. The low-pixel electrode PE2 may be disposed on the fourth low-pixel area P42. The first switching element SW1, the second switching element SW2 and the third switching element SW3 may be disposed on the fourth light-blocking area BA4. In addition, contact holes exposing a portion of the first switching element SW1, the second switching element SW2 and the third switching element SW3 may be defined in the fourth light-blocking area BA4.

A column spacer CS is disposed on the organic layer. The column spacer CS maintains a distance between the display substrate and an opposing substrate opposing the display substrate. The column spacer CS may include material having elasticity with respect to an external pressure. In an exemplary embodiment, the column spacer CS may include an acrylic resin, for example. In an exemplary embodiment, the column spacer CS may include the same material as that of the white color filter WC. In an exemplary embodiment, the column spacer CS may be provided by the same process as the white color filter WC.

The column spacer CS may be overlapped with the first switching element SW1. In the illustrated exemplary embodiment, one column spacer CS is disposed on the plurality of sub-pixels. However, the invention is not limited thereto. In an alternative exemplary embodiment, the number of the column spacers CS may be changed according to a size of a display substrate.

In the illustrated exemplary embodiment, the white color filter WC includes the same material as that of the column spacer CS. That is, the white color filter WC and the column spacer CS include material having elasticity with respect to an external pressure. Therefore, it is difficult to define a contact hole in the white color filter WC, and thus defects of a display apparatus may be occurred.

However, in the exemplary embodiment, the blue color filter BC is disposed on the light-blocking area of a sub-pixel on which the white color filter WC is disposed. That is, the blue color filter BC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

FIGS. 14 to 19 are cross-sectional views illustrating a method of manufacturing the display substrate of FIG. 12.

Figure 14:
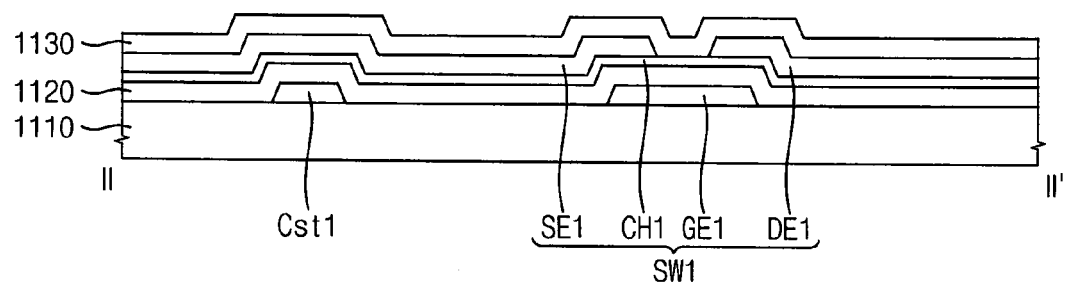
FIGS. 14 to 19 are cross-sectional views illustrating a method of manufacturing the display substrate of FIG. 12.

Referring to FIG. 14, a gate metal layer is disposed on a base substrate 1110, and then the gate metal layer may be partially etched by a photolithography process or an etching process using an additional etching mask. Hence, the gate pattern is provided. The gate pattern includes a first storage line Cst1, a gate line GL, a first gate electrode GE1, a second gate electrode GE2 and a third gate electrode GE3.

The base substrate 1110 may include a material which has relatively high transmittance, thermal resistance, and chemical resistance. In an exemplary embodiment, the base substrate 1110 may include any one of glass, polyethylenenaphthalate, polyethylene terephthalate, polyacryl and a combination thereof, for example.

The gate pattern may include a metal, a metal alloy, a metal nitride, a conductive metal oxide, a transparent conductive material, and etc. In an exemplary embodiment, the gate pattern may include copper (Cu) which is opaque, for example.

The first insulation layer 1120 is disposed on the base substrate 110 on which the gate pattern is disposed. The first insulation layer 1120 is disposed on the gate pattern. The first insulation layer 1120 covers and insulates the first storage line Cst1, the gate line GL, the first gate electrode GE1, the second gate electrode GE2 (refer to FIG. 12) and the third gate electrode GE3 (refer to FIG. 12).

Thereafter, a semiconductor layer and a data metal layer are disposed on the base substrate 1110 on which the first insulation layer 1120 is disposed.

In an exemplary embodiment, the semiconductor layer may include a silicon semiconductor layer including amorphous silicon (a-Si:H) and an ohmic contact layer including n+ amorphous silicon (n+ a-Si:H), for example. In an exemplary embodiment, the semiconductor layer may include an oxide semiconductor. In an exemplary embodiment, the oxide semiconductor may include an amorphous oxide including at least one of indium (In), zinc (Zn), gallium (Ga), tin (Sn) and hafnium (Hf), for example.

In an exemplary embodiment, the data metal layer may have a single layer structure including at least one of copper (Cu), silver (Ag), chrome (Cr), molybdenum (Mo), aluminum (Al), titanium (Ti), manganese (Mn) and a combination thereof. In addition, the data metal layer may have a multi layer structure having a plurality of layers including materials different each other. In an exemplary embodiment, the data metal layer may include a copper layer and a titanium layer disposed on and/or under the copper layer.

Thereafter, the semiconductor layer and the data metal layer may be partially etched by a photolithography process or an etching process using an additional etching mask. Hence, a channel layer including a first channel portion CH1, a second channel portion CH2 (refer to FIG. 12) and a third channel portion CH3 (refer to FIG. 12), and data pattern are provided. In an exemplary embodiment, the channel layer may include a silicon semiconductor layer including amorphous silicon (a-Si:H) and an ohmic contact layer including n+ amorphous silicon (n+ a-Si:H), for example. In an exemplary embodiment, the channel layer may include an oxide semiconductor. In an exemplary embodiment, the oxide semiconductor may include an amorphous oxide including at least one of indium (In), zinc (Zn), gallium (Ga), tin (Sn) and hafnium (Hf), for example.

The data pattern includes a first drain electrode DE1, a first source electrode SE1, a second source electrode SE2 (refer to FIG. 12), a second drain electrode DE2 (refer to FIG. 12), a third source electrode SE3 (refer to FIG. 12), a third drain electrode DE3 (refer to FIG. 12), a first data line DL1 and a second data line DL2 (refer to FIG. 1). In an exemplary embodiment, the semiconductor layer and the data metal layer are patterned at the same time, and then a portion of the metal layer, which is patterned, is removed. Hence, the first source electrode SE1 and the first drain electrode DE1 spaced apart from the first source electrode SE1. In addition, the second source electrode SE2 (refer to FIG. 12) and the second drain electrode DE2 (refer to FIG. 12) spaced apart from the second source electrode SE2 may be provided by removing a portion of the patterned metal layer. In addition, the third source electrode SE3 (refer to FIG. 12) and the third drain electrode DE3 (refer to FIG. 12) spaced apart from the third source electrode SE3 (refer to FIG. 12) may be provided by removing a portion of the patterned metal layer.

A second insulation layer 1130 is disposed on the base substrate 1110 on which the data pattern and the channel layer are disposed.

In an exemplary embodiment, the second insulation layer 1130 may be provided by a spin coating process, a printing process, a sputtering process, a CVD process, an ALD process, a PECVD process, an HDP-CVD process or a vacuum evaporation process in accordance with ingredients included in the second insulation layer 1130, for example. The second insulation layer 1130 is disposed on the data pattern. The second insulation layer 1130 covers and insulates the first drain electrode DE1, the first source electrode SE1, the second source electrode SE2 (refer to FIG. 12), the second drain electrode DE2 (refer to FIG. 12), the third source electrode SE3 (refer to FIG. 12), the third drain electrode DE3 (refer to FIG. 12) and the data line DL (refer to FIG. 12).

Figure 15:
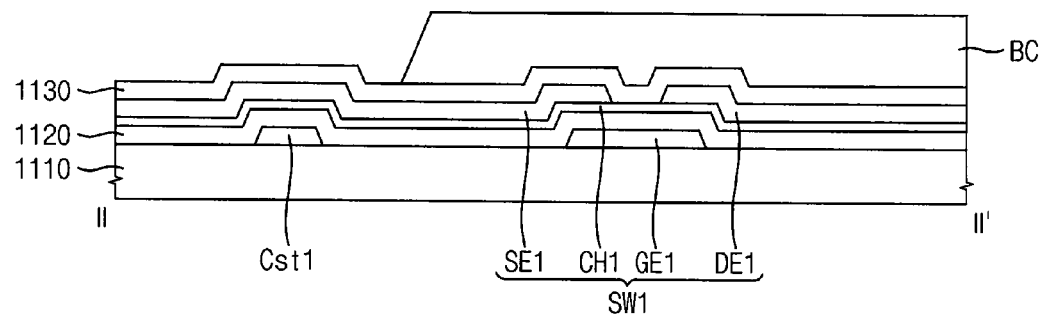

Referring to FIG. 15, an organic layer is disposed on the base substrate 1110 on which the second insulation layer 1130 is disposed. The organic layer may be a color filter layer. A photoresist is disposed on the second insulation layer 1130, and then the photoresist is exposed using a mask, and then the photoresist is developed using a developing solution. Hence, the organic layer may be provided.

The organic layer is disposed on the second insulation layer 1130. When the organic layer is color filter layer, the color filter layer supplies colors to the light passing through the liquid crystal layer. When the organic layer is a color filter layer, the color filter layer may be a color filter layer having a red color filter RC, a green color filter GC or a blue color filter BC. The color filter layer corresponds to a unit pixel. The color filter layers adjacent to each other may have different colors. The color filter layer may be overlapped with adjacent color filter layer in a boundary of the adjacent unit pixels. In an exemplary embodiment, the color filter layer may be spaced apart from adjacent color filter layer in the boundary of the adjacent unit pixels. In addition, the red color filter RC, the green color filter GC and the blue color filter BC may be stacked sequentially. However, the invention is not limited thereto. In an alternative exemplary embodiment, a stacking order of the color filters may be changed. In an exemplary embodiment, the green color filter GC, the red color filter RC and the blue color filter BC may be stacked sequentially.

Figure 16:
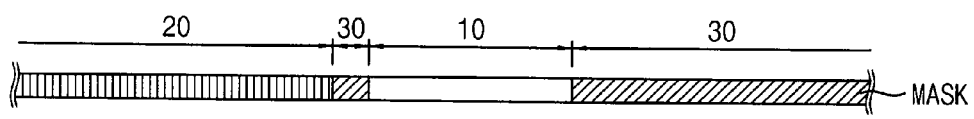
Figure 16:
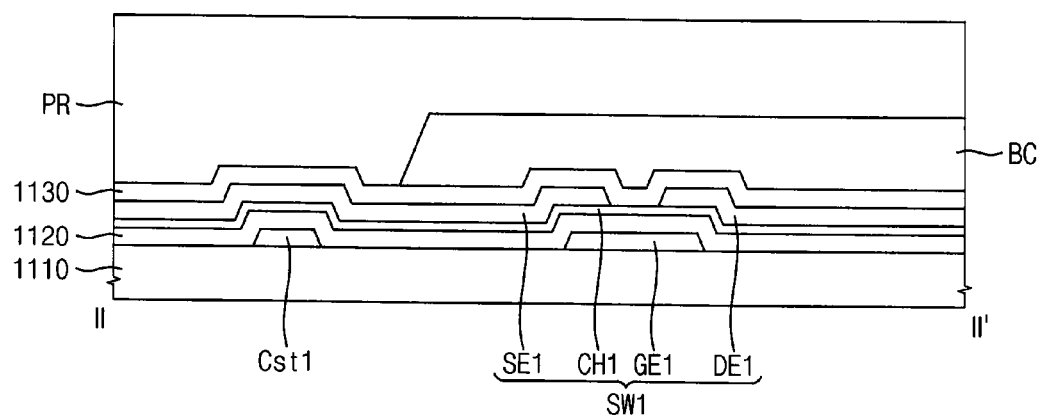

Referring to FIG. 16, a photoresist PR including a transparent material is disposed on the base substrate 1110 on which the blue color filter BC is disposed. In an exemplary embodiment, the photoresist PR may be a negative photosensitive material, for example.

Thereafter, an exposing mask including a transmitting part 10, a shielding part 30, and a diffracting part 20 is arranged on the base substrate 110. The exposing mask includes a half-tone mask having a half-tone layer provided on an area corresponding to the diffracting part 20. In an exemplary embodiment, the exposing mask may include a slit mask including a metal layer having a minute pattern provided on an area corresponding to the diffracting part 20.

When light is irradiated into the exposing mask, the transmitting part 10 transmits the light and the shielding part 30 shields the light. The diffracting part 20 diffracts the light so that some of the light is transmitted through the exposing mask.

When the photoresist PR exposed to the light through the exposing mask is developed, a portion of the photoresist PR corresponding to the shielding part is dissolved to be removed and a portion of the photoresist PR corresponding to the transmitting part 10 remains with a thickness substantially the same as that of the photoresist PR before the photoresist PR is developed. A portion of the photoresist PR remains with a thickness thinner than that of the photoresist PR before the photoresist PR is developed.

Figure 17:
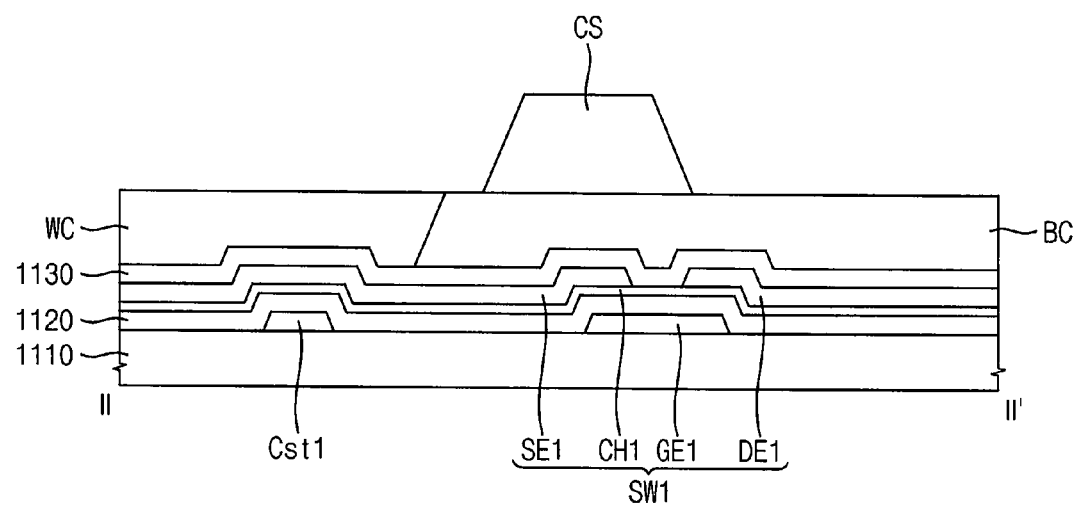

Referring to FIG. 17, the white color filter WC and the column spacer CS are provided.

The column spacer CS maintains a distance between the display substrate and an opposing substrate opposing the display substrate. The column spacer CS may include material having elasticity with respect to an external pressure. The column spacer CS may include a transparent material. In an exemplary embodiment, the column spacer CS may include an acrylic resin, for example. The column spacer CS may include the same material as that of the white color filter WC. The column spacer CS may be provided by the same process as the white color filter WC.

Figure 18:
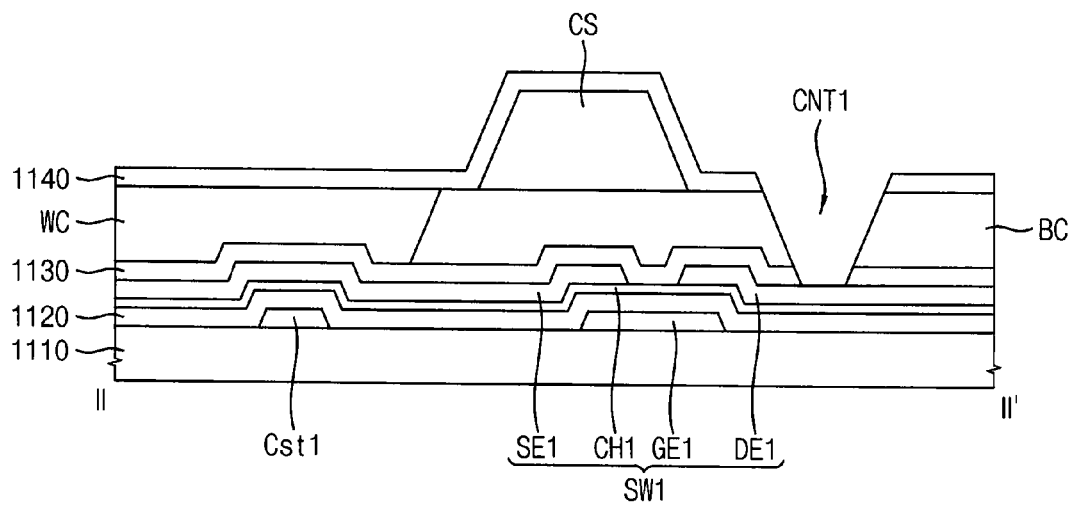

Referring to FIG. 18, a third insulation layer 1140 is disposed on the base substrate 1110 on which the white color filter WC and the column spacer CS are disposed. Thereafter, a first contact hole CNT1 passing the third insulation layer 1140 and the organic layer is defined.

In an exemplary embodiment, the third insulation layer 1140 may be provided by a spin coating process, a printing process, a sputtering process, a CVD process, an ALD process, a PECVD process, an HDP-CVD process or a vacuum evaporation process in accordance with ingredients included in the third insulation layer 1140, for example. The third insulation layer 1140 covers and insulates the organic layer and the column spacer CS.

Thereafter, a first contact hole CNT1 passing the third insulation layer 1140 and the organic layer is defined.

In the illustrated exemplary embodiment, the white color filter WC includes the same material as that of the column spacer CS. That is, the white color filter WC and the column spacer CS include material having elasticity with respect to an external pressure. Therefore, it is difficult to define a contact hole in the white color filter WC, and thus defects of a display apparatus may be occurred.

However, in the illustrated exemplary embodiment, the blue color filter BC is disposed on the light-blocking area of a sub-pixel on which the white color filter WC is disposed. That is, the blue color filter BC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

Figure 19:
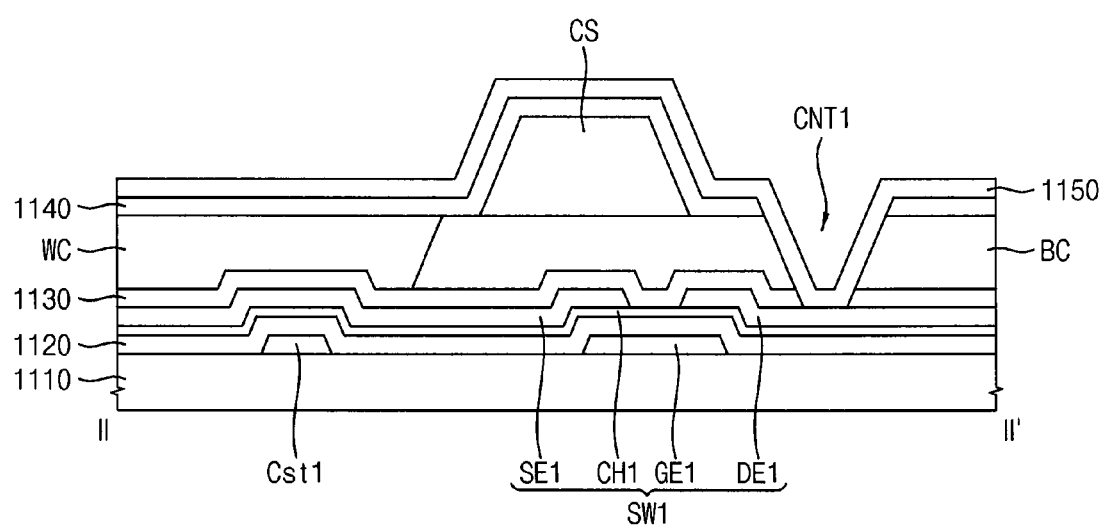

Referring to FIG. 19, a transparent conductive layer 1150 is disposed on the base substrate 1110 in which the first contact hole CNT1 is defined.

In an exemplary embodiment, the transparent conductive layer 1150 may include a transparent conductive material, such as ITO and IZO. In an exemplary embodiment, the transparent conductive layer 1150 may include titanium (Ti) and/or molybdenum titanium (MoTi), for example.

Referring to FIG. 13, the transparent conductive layer 1150 is patterned to provide a shielding electrode SC and a pixel electrode. The pixel electrode may include a high-pixel electrode PE1 and a low-pixel electrode PE2.

In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

According to the illustrated exemplary embodiment, the blue color filter BC is disposed on the light-blocking area of a sub-pixel on which the white color filter WC is disposed. That is, the blue color filter BC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

Figure 20:
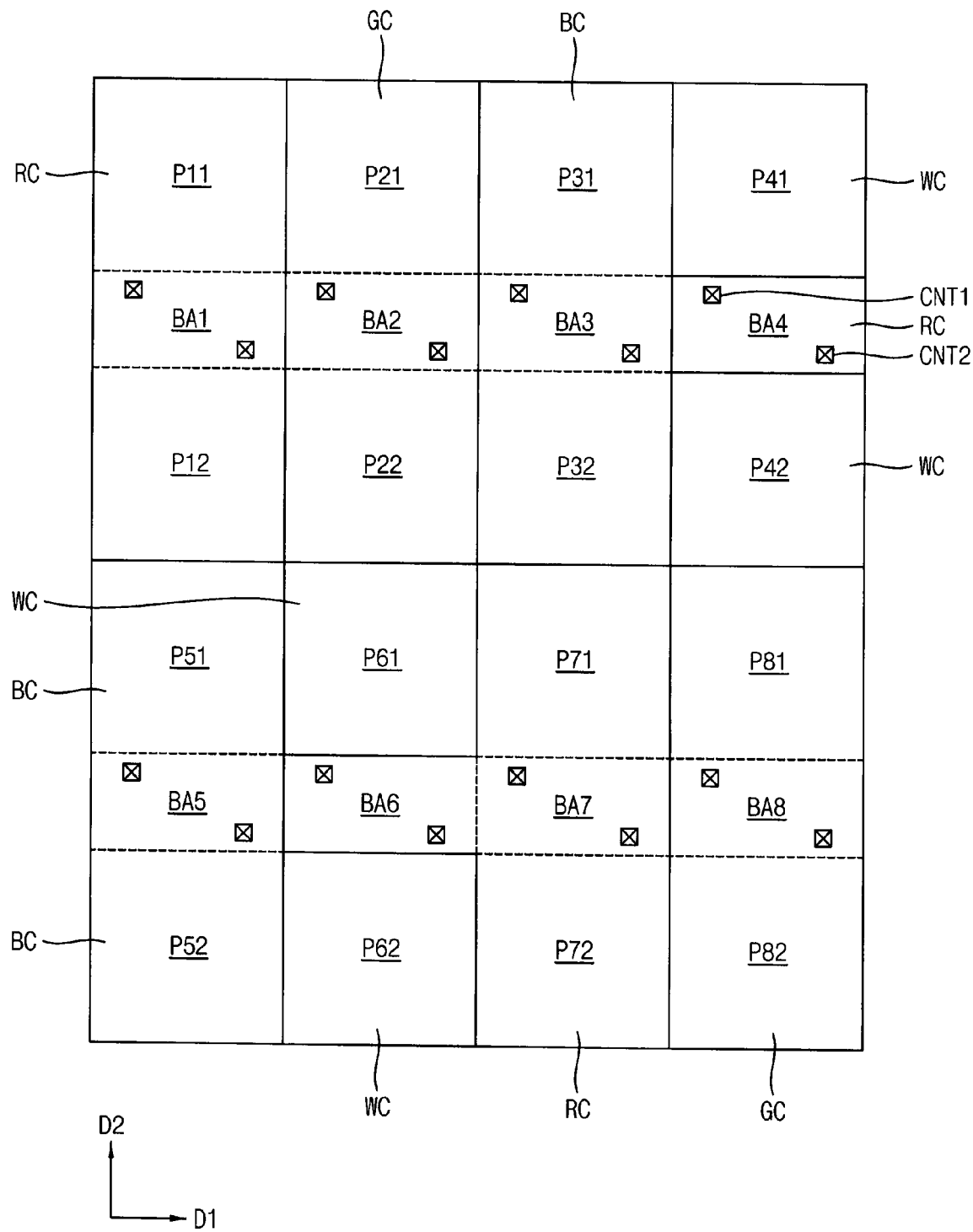
FIG. 20 is a plan view illustrating an exemplary embodiment of a color filter according to the invention.
Figure 21:
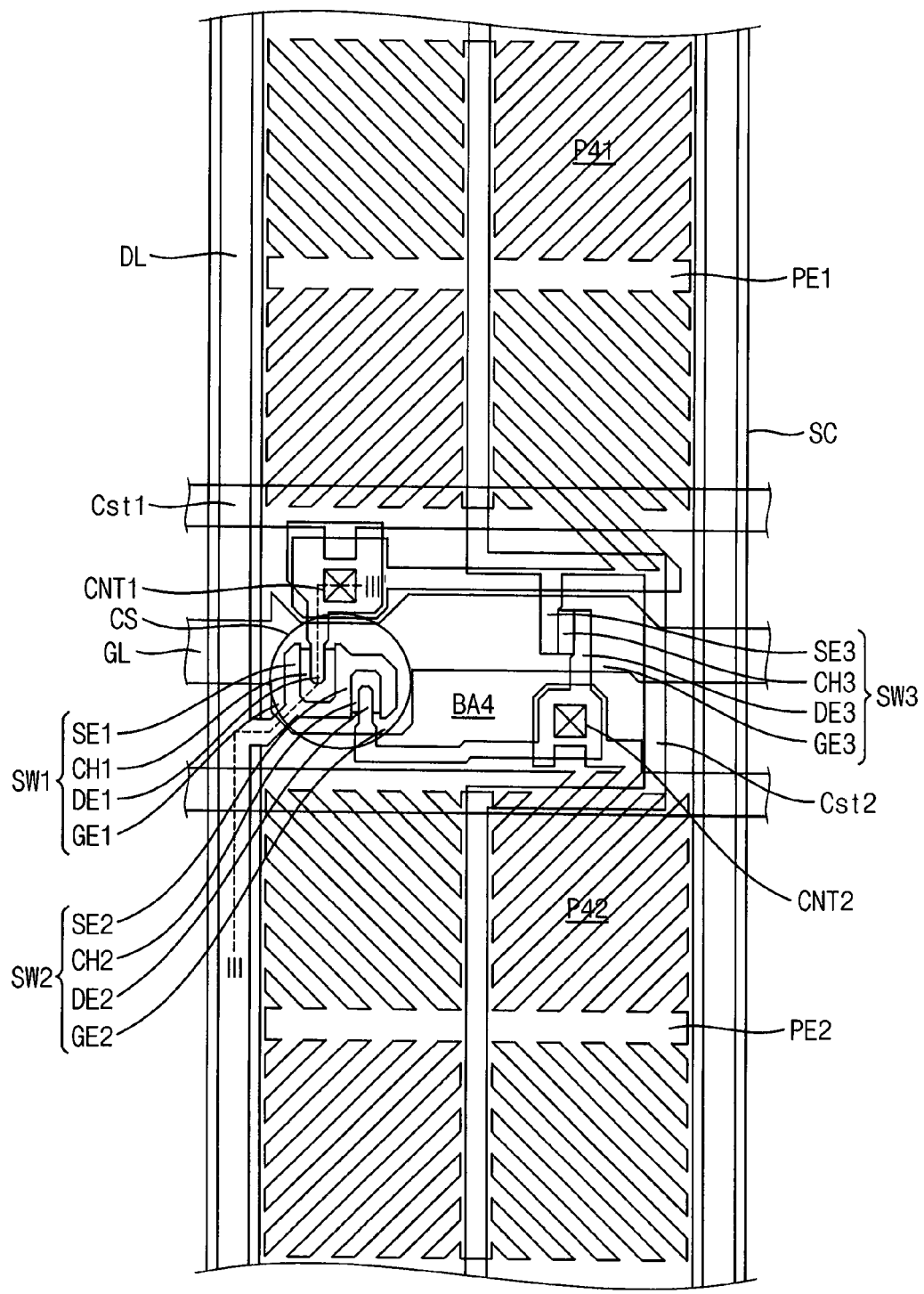
FIG. 21 is a plan view illustrating an exemplary embodiment of a unit pixel according to the invention.
Figure 22:
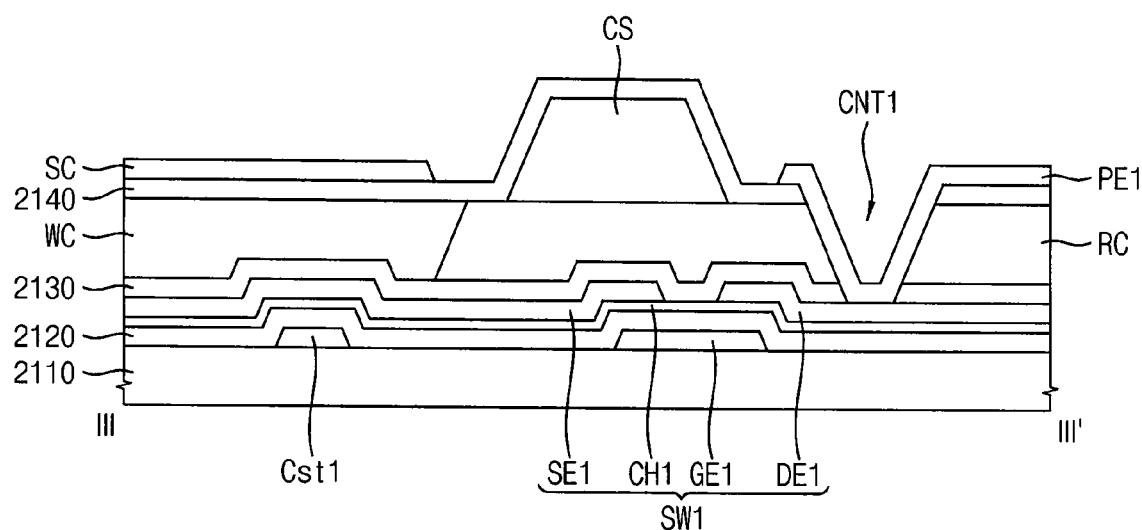
FIG. 22 is a cross-sectional view taken along line of FIG. 21.

FIG. 20 is a plan view illustrating a color filter according to an exemplary embodiment of the invention. FIG. 21 is a plan view illustrating a unit pixel according to an exemplary embodiment of the invention. FIG. 22 is a cross-sectional view taken along line of FIG. 21.

The display substrate according to the exemplary embodiment is substantially same as the display substrate of the FIGS. 1 to 10 except for a red color filter RC, a green color filter GC, a blue color filter BC and a white color filter WC, and thus same reference numerals are used for same elements and repetitive explanation will be omitted.

Referring to FIGS. 1, 20 to 22, a display substrate includes a gate line GL, a data line DL, a first storage line Cst1, a second storage line Cst2, a first switching element SW1, a second switching element SW2, a third switching element SW3, a high-pixel electrode PE1 and a low-pixel electrode PE2.

An organic layer is disposed on the second insulation layer 2130. The organic layer planarizes an upper surface of the substrate so that problems due to the step such as disconnection of a signal line may be prevented. The organic layer may be an insulation layer including an organic material. In an exemplary embodiment, the organic layer may a color filter layer.

When the organic layer is a color filter layer, the color filter layer may be a color filter layer having a red color filter RC, a green color filter GC, a blue color filter BC or a white color filter WC. In an exemplary embodiment, the red color filter RC, the green color filter GC, the blue color filter BC and the white color filter WC may be stacked sequentially.

A display substrate according to an exemplary embodiment of the invention may include a plurality of sub-pixels. The red color filter RC, the green color filter GC, the blue color filter BC and the white color filter WC may be disposed on sub-pixel respectively.

The sub-pixel of the display substrate may include a light-blocking area, a high-pixel area disposed adjacent to the light-blocking area and a low-pixel area disposed opposite to the high-pixel area with reference to the light-blocking area. The red color filter RC, the green color filter GC, the blue color filter BC and the white color filter WC may be disposed on a light-blocking area, a high-pixel area and a low-pixel area of the sub-pixel respectively.

The red color filter RC is disposed on a first sub-pixel and a fourth light-blocking area BA4. The first sub-pixel includes a first high-pixel area P11, a first low-pixel area P12 and a first light-blocking area BA1. The first high-pixel area P11 is disposed adjacent to the first light-blocking area BA1. The first low-pixel area P12 is disposed opposite to the first high-pixel area P11 with reference to the first light-blocking area BA1. The high-pixel electrode PE1 may be disposed on the first high-pixel area P11. The low-pixel electrode PE2 may be disposed on the first low-pixel area P12. The first switching element SW1, the second switching element SW2 and the third switching element SW3 may be disposed on the first light-blocking area BA1. In addition, contact holes exposing a portion of the first switching element SW1, the second switching element SW2 and the third switching element SW3 may be defined in the first light-blocking area BA1.

The green color filter GC is disposed on a second sub-pixel. The second sub-pixel includes a second high-pixel area P21, a second low-pixel area P22 and a second light-blocking area BA2. The second high-pixel area P21 is disposed adjacent to the second light-blocking area BA2. The second low-pixel area P22 is disposed opposite to the second high-pixel area P21 with reference to the second light-blocking area BA2. The high-pixel electrode PE1 may be disposed on the second high-pixel area P21. The low-pixel electrode PE2 may be disposed on the second low-pixel area P22. The first switching element SW1, the second switching element SW2 and the third switching element SW3 may be disposed on the second light-blocking area BA2. In addition, contact holes exposing a portion of the first switching element SW1, the second switching element SW2 and the third switching element SW3 may be defined on the second light-blocking area BA2.

The blue color filter BC is disposed on a third sub-pixel. The third sub-pixel includes a third high-pixel area P31, a third low-pixel area P32 and a fourth light-blocking area BA4. The third high-pixel area P31 is disposed adjacent to the third light-blocking area BA3. The third low-pixel area P32 is disposed opposite to the third high-pixel area P31 with reference to the third light-blocking area BA3. The high-pixel electrode PE1 may be disposed on the third high-pixel area P31. The low-pixel electrode PE2 may be disposed on the third low-pixel area P32. The first switching element SW1, the second switching element SW2 and the third switching element SW3 may be disposed on the third light-blocking area BA3. In addition, contact holes exposing a portion of the first switching element SW1, the second switching element SW2 and the third switching element SW3 may be defined in the third light-blocking area BA3.

The white color filter WC is disposed on a fourth high-pixel area P41 of a fourth sub-pixel and a fourth low-pixel area P42 of the fourth sub-pixel. The fourth sub-pixel includes a fourth high-pixel area P41, a fourth low-pixel area P42 and a fourth light-blocking area BA4. The fourth high-pixel area P41 is disposed adjacent to the fourth light-blocking area BA4. The fourth low-pixel area P42 is disposed opposite to the fourth high-pixel area P41 with reference to the fourth light-blocking area BA4. The high-pixel electrode PE1 may be disposed on the fourth high-pixel area P41. The low-pixel electrode PE2 may be disposed on the fourth low-pixel area P42. The first switching element SW1, the second switching element SW2 and the third switching element SW3 may be disposed on the fourth light-blocking area BA4. In addition, contact holes exposing a portion of the first switching element SW1, the second switching element SW2 and the third switching element SW3 may be defined in the fourth light-blocking area BA4.

A column spacer CS is disposed on the organic layer. The column spacer CS maintains a distance between the display substrate and an opposing substrate opposing the display substrate. The column spacer CS may include material having elasticity with respect to an external pressure. In an exemplary embodiment, the column spacer CS may include an acrylic resin. The column spacer CS may include the same material as that of the white color filter WC. The column spacer CS may be provided by the same process as the white color filter WC.

The column spacer CS may be overlapped with the first switching element SW1. In the illustrated exemplary embodiment, one column spacer CS is disposed on the plurality of sub-pixels. However, the invention is not limited thereto. In an alternative exemplary embodiment, the number of the column spacers CS may be changed according to a size of a display substrate.

In the exemplary embodiment, the white color filter WC includes the same material as that of the column spacer CS. That is, the white color filter WC and the column spacer CS include material having elasticity with respect to an external pressure. Therefore, it is difficult to define a contact hole in the white color filter WC, and thus defects of a display apparatus may be occurred.

However, in the exemplary embodiment, the red color filter RC is disposed on the light-blocking area of a sub-pixel on which the white color filter WC is disposed. That is, the red color filter RC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

FIGS. 23 to 28 are cross-sectional views illustrating a method of manufacturing the display substrate of FIG. 21.

Figure 23:
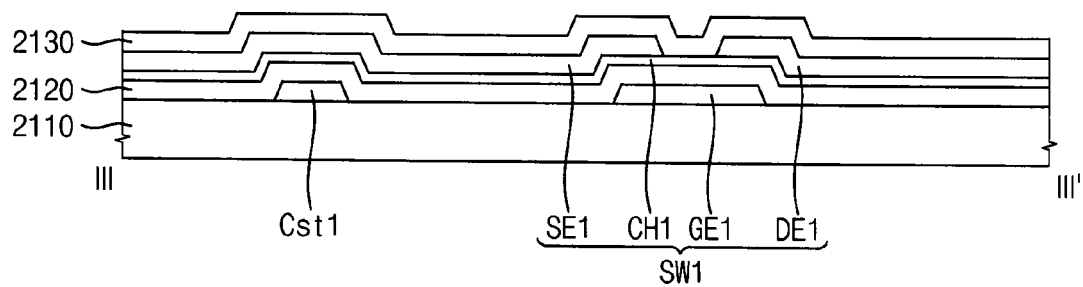
FIGS. 23 to 28 are cross-sectional views illustrating a method of manufacturing the display substrate of FIG. 21.

Referring to FIG. 23, a gate metal layer is disposed on a base substrate 2110, and then the gate metal layer may be partially etched by a photolithography process or an etching process using an additional etching mask. Hence, the gate pattern is provided. The gate pattern includes a first storage line Cst1, a gate line GL, a first gate electrode GE1, a second gate electrode GE2 (refer to FIG. 21) and a third gate electrode GE3 (refer to FIG. 21).

The base substrate 2110 may include a material which has relatively high transmittance, thermal resistance, and chemical resistance. In an exemplary embodiment, the base substrate 2110 may include any one of glass, polyethylenenaphthalate, polyethylene terephthalate, polyacryl and a combination thereof, for example.

The gate pattern may include a metal, a metal alloy, a metal nitride, a conductive metal oxide, a transparent conductive material, and etc. In an exemplary embodiment, the gate pattern may include copper (Cu) which is opaque, for example.

The first insulation layer 2120 is disposed on the base substrate 2110 on which the gate pattern is disposed. The first insulation layer 2120 is disposed on the gate pattern. The first insulation layer 2120 covers and insulates the first storage line Cst1, the gate line GL, the first gate electrode GE1, the second gate electrode GE2 (refer to FIG. 21) and the third gate electrode GE3 (refer to FIG. 21).

Thereafter, a semiconductor layer and a data metal layer are disposed on the base substrate 2110 on which the first insulation layer 2120 is disposed.

In an exemplary embodiment, the semiconductor layer may include a silicon semiconductor layer including amorphous silicon (a-Si:H) and an ohmic contact layer including n+ amorphous silicon (n+ a-Si:H), for example. In an exemplary embodiment, the semiconductor layer may include an oxide semiconductor. In an exemplary embodiment, the oxide semiconductor may include an amorphous oxide including at least one of indium (In), zinc (Zn), gallium (Ga), tin (Sn) and hafnium (Hf), for example.

In an exemplary embodiment, the data metal layer may have a single layer structure including at least one of copper (Cu), silver (Ag), chrome (Cr), molybdenum (Mo), aluminum (Al), titanium (Ti), manganese (Mn) and a combination thereof. In addition, the data metal layer may have a multi layer structure having a plurality of layers including materials different each other. In an exemplary embodiment, the data metal layer may include a copper layer and a titanium layer disposed on and/or under the copper layer.

Thereafter, the semiconductor layer and the data metal layer may be partially etched by a photolithography process or an etching process using an additional etching mask. Hence, a channel layer including a first channel portion CH1, a second channel portion CH2 (refer to FIG. 21) and a third channel portion CH3 (refer to FIG. 21), and data pattern are provided. In an exemplary embodiment, the channel layer may include a silicon semiconductor layer including amorphous silicon (a-Si:H) and an ohmic contact layer including n+ amorphous silicon (n+ a-Si:H), for example. In an exemplary embodiment, the channel layer may include an oxide semiconductor. In an exemplary embodiment, the oxide semiconductor may include an amorphous oxide including at least one of indium (In), zinc (Zn), gallium (Ga), tin (Sn) and hafnium (Hf), for example.

The data pattern includes a first drain electrode DE1, a first source electrode SE1, a second source electrode SE2 (refer to FIG. 21), a second drain electrode DE2 (refer to FIG. 21), a third source electrode SE3 (refer to FIG. 21), a third drain electrode DE3 (refer to FIG. 21), a first data line DL1 (refer to FIG. 1) and a second data line DL2 (refer to FIG. 1). In an exemplary embodiment, the semiconductor layer and the data metal layer are patterned at the same time, and then a portion of the metal layer, which is patterned, is removed. Hence, the first source electrode SE1 and the first drain electrode DE1 spaced apart from the first source electrode SE1. In addition, the second source electrode SE2 (refer to FIG. 21) and the second drain electrode DE2 (refer to FIG. 21) spaced apart from the second source electrode SE2 (refer to FIG. 21) may be provided by removing a portion of the patterned metal layer. In addition, the third source electrode SE3 (refer to FIG. 21) and the third drain electrode DE3 (refer to FIG. 21) spaced apart from the third source electrode SE3 (refer to FIG. 21) may be provided by removing a portion of the patterned metal layer.

A second insulation layer 2130 is disposed on the base substrate 2110 on which the data pattern and the channel layer are disposed.

In an exemplary embodiment, the second insulation layer 2130 may be provided by a spin coating process, a printing process, a sputtering process, a CVD process, an ALD process, a PECVD process, an HDP-CVD process or a vacuum evaporation process in accordance with ingredients included in the second insulation layer 2130, for example. The second insulation layer 2130 is disposed on the data pattern. The second insulation layer 2130 covers and insulates the first drain electrode DE1, the first source electrode SE1, the second source electrode SE2 (refer to FIG. 21), the second drain electrode DE2 (refer to FIG. 21), the third source electrode SE3, the third drain electrode DE3 (refer to FIG. 21) and the data line DL.

Figure 24:
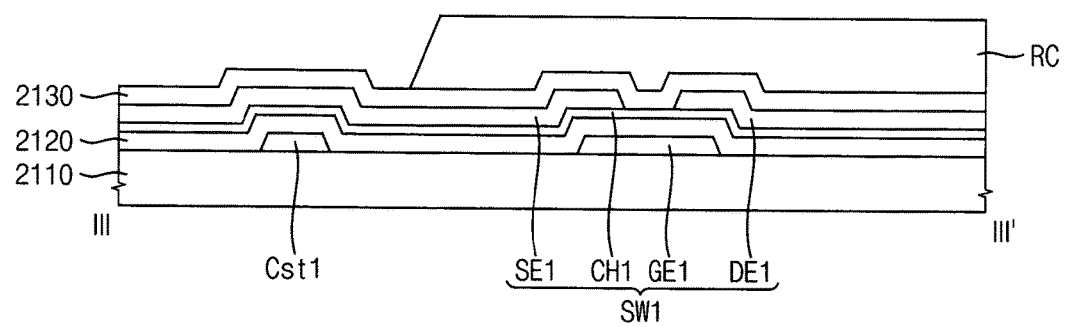

Referring to FIG. 24, an organic layer is disposed on the base substrate 2110 on which the second insulation layer 2130 is disposed. The organic layer may be a color filter layer. A photoresist is disposed on the second insulation layer 2130, and then the photoresist is exposed using a mask, and then the photoresist is developed using a developing solution. Hence, the organic layer may be provided.

The organic layer is disposed on the second insulation layer 2130. When the organic layer is color filter layer, the color filter layer supplies colors to the light passing through the liquid crystal layer. When the organic layer is a color filter layer, the color filter layer may be a color filter layer having a red color filter RC, a green color filter GC or a blue color filter BC, for example. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels. In addition, the red color filter RC, the green color filter GC and the blue color filter BC may be stacked sequentially. However, the invention is not limited thereto. In an alternative exemplary embodiment, a stacking order of the color filters may be changed. In an exemplary embodiment, the green color filter GC, the red color filter RC and the blue color filter BC may be stacked sequentially, for example.

Figure 25:
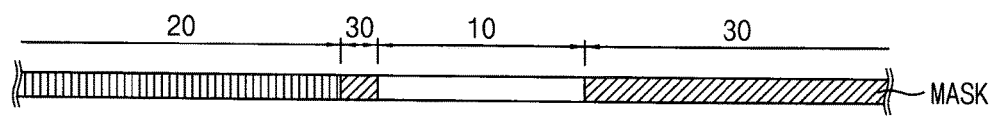
Figure 25:
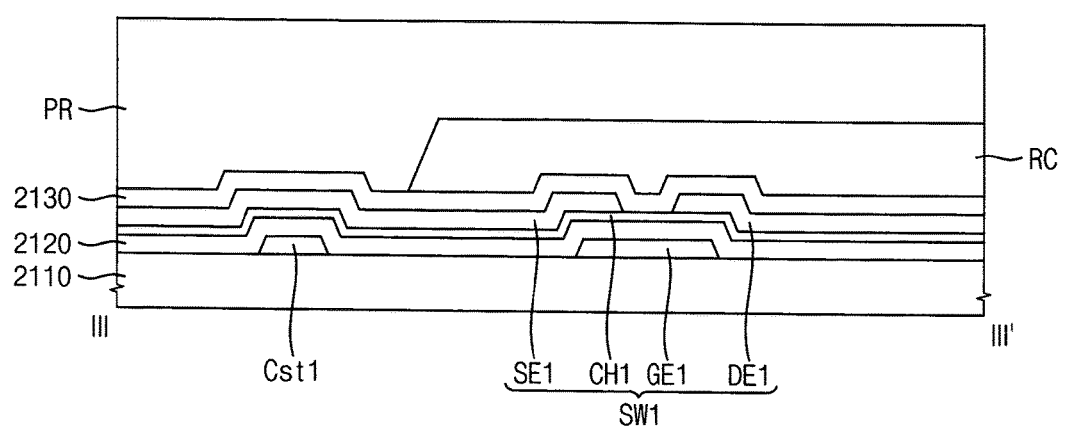

Referring to FIG. 25, a photoresist PR including a transparent material is disposed on the base substrate 2110 on which the red color filter RC is disposed. In an exemplary embodiment, the photoresist PR may be a negative photosensitive material, for example.

Thereafter, an exposing mask including a transmitting part 10, a shielding part 30, and a diffracting part 20 is arranged on the base substrate 110. The exposing mask includes a half-tone mask having a half-tone layer disposed on an area corresponding to the diffracting part 20. In addition, the exposing mask may include a slit mask including a metal layer having a minute pattern disposed on an area corresponding to the diffracting part 20.

When light is irradiated into the exposing mask, the transmitting part 10 transmits the light and the shielding part 30 shields the light. The diffracting part 20 diffracts the light so that some of the light is transmitted through the exposing mask.

When the photoresist PR exposed to the light through the exposing mask is developed, a portion of the photoresist PR corresponding to the shielding part is dissolved to be removed and a portion of the photoresist PR corresponding to the transmitting part 10 remains with a thickness substantially the same as that of the photoresist PR before the photoresist PR is developed. A portion of the photoresist PR remains with a thickness thinner than that of the photoresist PR before the photoresist PR is developed.

Figure 26:
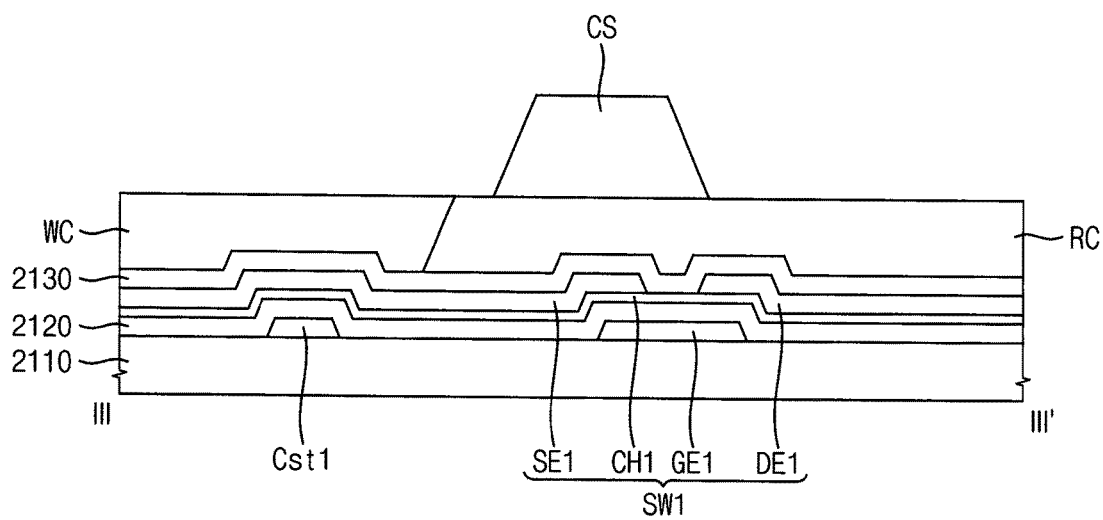

Referring to FIG. 26, the white color filter WC and the column spacer CS are provided.

The column spacer CS maintains a distance between the display substrate and an opposing substrate opposing the display substrate. The column spacer CS may include material having elasticity with respect to an external pressure. The column spacer CS may include a transparent material. In an exemplary embodiment, the column spacer CS may include an acrylic resin, for example. The column spacer CS may include the same material as that of the white color filter WC. The column spacer CS may be provided by the same process as the white color filter WC.

Figure 27:
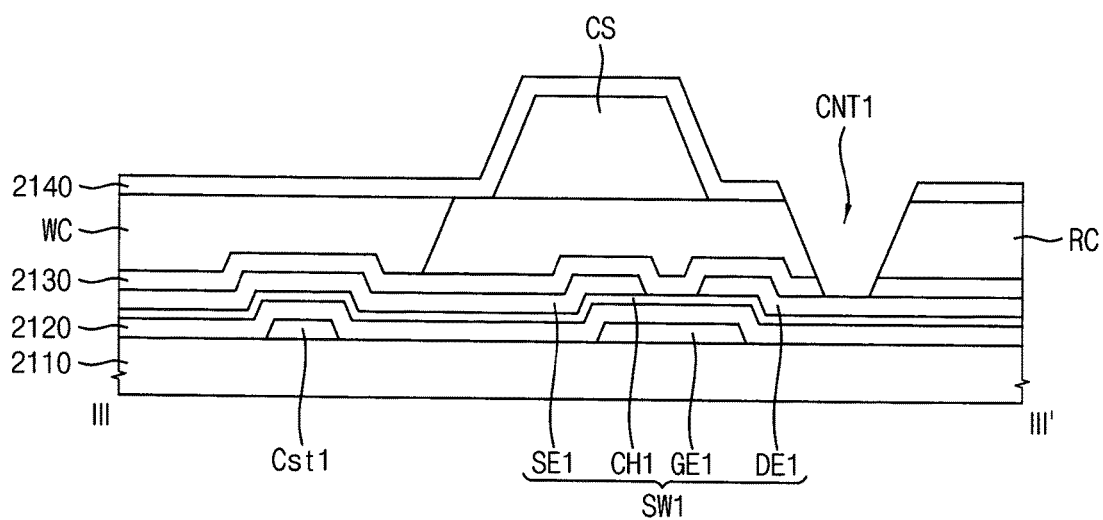

Referring to FIG. 27, a third insulation layer 2140 is disposed on the base substrate 110 on which the white color filter WC and the column spacer CS are disposed. Thereafter, a first contact hole CNT1 passing the third insulation layer 2140 and the organic layer is defined.

In an exemplary embodiment, the third insulation layer 2140 may be provided by a spin coating process, a printing process, a sputtering process, a CVD process, an ALD process, a PECVD process, an HDP-CVD process or a vacuum evaporation process in accordance with ingredients included in the third insulation layer 2140, for example. The third insulation layer 2140 covers and insulates the organic layer and the column spacer CS.

Thereafter, a first contact hole CNT1 passing the third insulation layer 2140 and the organic layer is defined.

In the exemplary embodiment, the white color filter WC includes the same material as that of the column spacer CS. That is, the white color filter WC and the column spacer CS include material having elasticity with respect to an external pressure. Therefore, it is difficult to define a contact hole in the white color filter WC, and thus defects of a display apparatus may be occurred.

However, in the illustrated exemplary embodiment, the red color filter RC is disposed on the light-blocking area of a sub-pixel on which the white color filter WC is disposed. That is, the red color filter RC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

Figure 28:
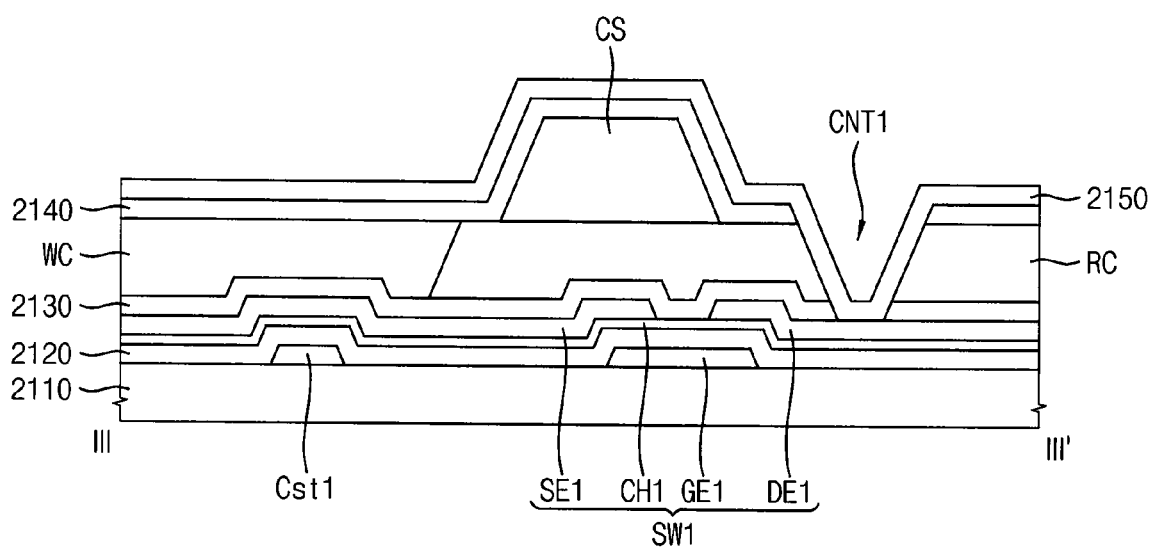

Referring to FIG. 28, a transparent conductive layer 2150 is disposed on the base substrate 2110 in which the first contact hole CNT1 is defined.

In an exemplary embodiment, the transparent conductive layer 2150 may include a transparent conductive material, such as ITO and IZO. In an exemplary embodiment, the transparent conductive layer 2150 may include titanium (Ti) and/or molybdenum titanium (MoTi), for example.

Referring to FIG. 22, the transparent conductive layer 2150 is patterned to provide a shielding electrode SC and a pixel electrode. The pixel electrode may include a high-pixel electrode PE1 and a low-pixel electrode PE2.

In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

The high-pixel electrode PE1 and the low-pixel electrode PE2 may be provided formed from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

According to the exemplary embodiment, the red color filter RC is disposed on the light-blocking area of a sub-pixel on which the white color filter WC is disposed. That is, the red color filter RC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

Figure 29:
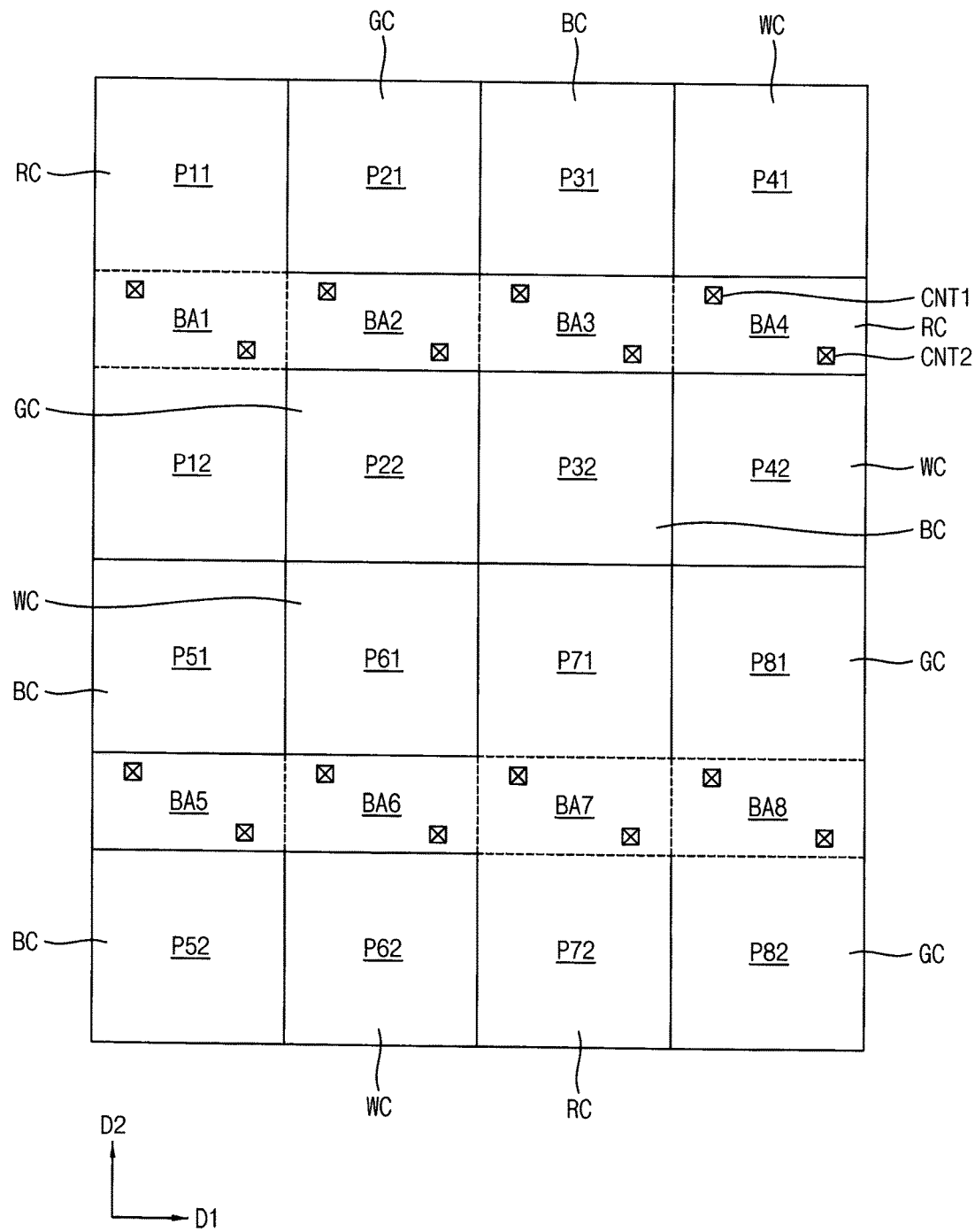
FIG. 29 is a plan view illustrating an exemplary embodiment of a color filter according to the invention.
Figure 30:
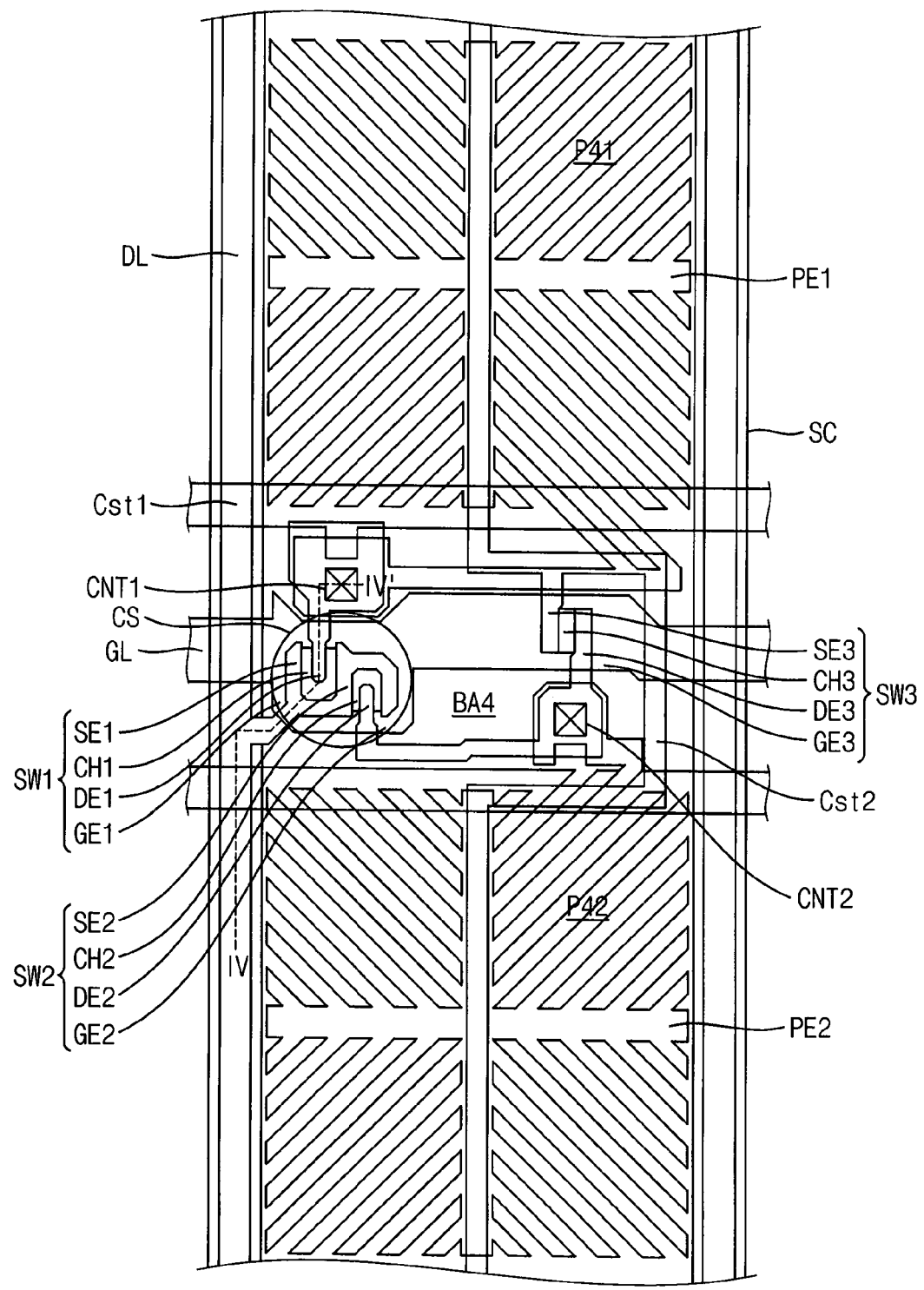
FIG. 30 is a plan view illustrating an exemplary embodiment of a unit pixel according to the invention.
Figure 31:
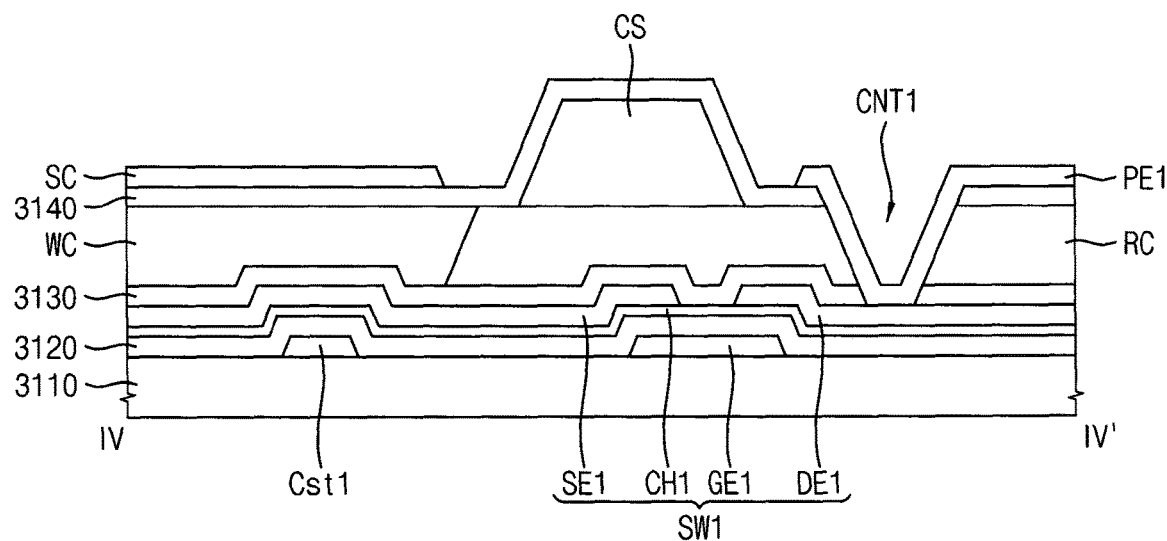
FIG. 31 is a cross-sectional view taken along line IV-IV' of FIG. 30.

FIG. 29 is a plan view illustrating a color filter according to an exemplary embodiment of the invention. FIG. 30 is a plan view illustrating a unit pixel according to an exemplary embodiment of the invention. FIG. 31 is a cross-sectional view taken along line IV-IV' of FIG. 30.

The display substrate according to the exemplary embodiment is substantially same as the display substrate of the FIGS. 1 to 10 except for a red color filter RC, a green color filter GC, a blue color filter BC and a white color filter WC, and thus same reference numerals are used for same elements and repetitive explanation will be omitted.

Referring to FIGS. 1, 29 to 31, a display substrate includes a gate line GL, a data line DL, a first storage line Cst1, a second storage line Cst2, a first switching element SW1, a second switching element SW2, a third switching element SW3, a high-pixel electrode PE1 and a low-pixel electrode PE2.

An organic layer is disposed on the second insulation layer 3130. The organic layer planarizes an upper surface of the substrate so that problems due to the step such as disconnection of a signal line may be prevented. The organic layer may be an insulation layer including an organic material. In an exemplary embodiment, the organic layer may a color filter layer, for example.

When the organic layer is a color filter layer, the color filter layer may be a color filter layer having a red color filter RC, a green color filter GC, a blue color filter BC or a white color filter WC. In an exemplary embodiment, the red color filter RC, the green color filter GC, the blue color filter BC and the white color filter WC may be stacked sequentially.

A display substrate according to an exemplary embodiment of the invention may include a plurality of sub-pixels. The red color filter RC, the green color filter GC, the blue color filter BC and the white color filter WC may be disposed on sub-pixel respectively.

The sub-pixel of the display substrate may include a light-blocking area, a high-pixel area disposed adjacent to the light-blocking area and a low-pixel area disposed opposite to the high-pixel area with reference to the light-blocking area. The red color filter RC, the green color filter GC, the blue color filter BC and the white color filter WC may be disposed on a light-blocking area, a high-pixel area and a low-pixel area of the sub-pixel respectively.

The red color filter RC is disposed on a first sub-pixel, a second light-blocking area BA2, a third light-blocking area BA3 and a fourth light-blocking area BA4. The first sub-pixel includes a first high-pixel area P11, a first low-pixel area P12 and a first light-blocking area BA1. The first high-pixel area P11 is disposed adjacent to the first light-blocking area BA1. The first low-pixel area P12 is disposed opposite to the first high-pixel area P11 with reference to the first light-blocking area BA1. The high-pixel electrode PE1 may be disposed on the first high-pixel area P11. The low-pixel electrode PE2 may be disposed on the first low-pixel area P12. The first switching element SW1, the second switching element SW2 and the third switching element SW3 may be disposed on the first light-blocking area BA1. In addition, contact holes exposing a portion of the first switching element SW1, the second switching element SW2 and the third switching element SW3 may be defined in the first light-blocking area BA1.

The green color filter GC is disposed on a second high-pixel area P21 of a second sub-pixel and a second low-pixel area P22 of the second sub-pixel. The second sub-pixel includes a second high-pixel area P21, a second low-pixel area P22 and a second light-blocking area BA2. The red color filter RC is disposed on the second light-blocking area BA2. The second high-pixel area P21 is disposed adjacent to the second light-blocking area BA2. The second low-pixel area P22 is disposed opposite to the second high-pixel area P21 with reference to the second light-blocking area BA2. The high-pixel electrode PE1 may be disposed on the second high-pixel area P21. The low-pixel electrode PE2 may be disposed on the second low-pixel area P22. The first switching element SW1, the second switching element SW2 and the third switching element SW3 may be disposed on the second light-blocking area BA2. In addition, contact holes exposing a portion of the first switching element SW1, the second switching element SW2 and the third switching element SW3 may be defined in the second light-blocking area BA2.

The blue color filter BC is disposed on a third high-pixel area P31 of a third sub-pixel and a third low-pixel area P32 of the third sub-pixel. The third sub-pixel includes a third high-pixel area P31, a third low-pixel area P32 and a third light-blocking area BA3. The red color filter RC is disposed on the third light-blocking area BA3. The third high-pixel area P31 is disposed adjacent to the third light-blocking area BA3. The third low-pixel area P32 is disposed opposite to the third high-pixel area P31 with reference to the third light-blocking area BA3. The high-pixel electrode PE1 may be disposed on the third high-pixel area P31. The low-pixel electrode PE2 may be disposed on the third low-pixel area P32. The first switching element SW1, the second switching element SW2 and the third switching element SW3 may be disposed on the third light-blocking area BA3. In addition, contact holes exposing a portion of the first switching element SW1, the second switching element SW2 and the third switching element SW3 may be defined in the third light-blocking area BA3.

The white color filter WC is disposed on a fourth high-pixel area P41 of a fourth sub-pixel and a fourth low-pixel area P42 of the fourth sub-pixel. The fourth sub-pixel includes a fourth high-pixel area P41, a fourth low-pixel area P42 and a fourth light-blocking area BA4. The blue color filter BC is disposed on the fourth light-blocking area BA4. The fourth high-pixel area P41 is disposed adjacent to the fourth light-blocking area BA4. The fourth low-pixel area P42 is disposed opposite to the fourth high-pixel area P41 with reference to the fourth light-blocking area BA4. The high-pixel electrode PE1 may be disposed on the fourth high-pixel area P41. The low-pixel electrode PE2 may be disposed on the fourth low-pixel area P42. The first switching element SW1, the second switching element SW2 and the third switching element SW3 may be disposed on the fourth light-blocking area BA4. In addition, contact holes exposing a portion of the first switching element SW1, the second switching element SW2 and the third switching element SW3 may be defined in the fourth light-blocking area BA4.

A column spacer CS is disposed on the organic layer. The column spacer CS maintains a distance between the display substrate and an opposing substrate opposing the display substrate. The column spacer CS may include material having elasticity with respect to an external pressure. In an exemplary embodiment, the column spacer CS may include an acrylic resin. The column spacer CS may include the same material as that of the white color filter WC. The column spacer CS may be provided by the same process as the white color filter WC.

The column spacer CS may be overlapped with the first switching element SW1. In the illustrated exemplary embodiment, one column spacer CS is disposed on the plurality of sub-pixels. However, the invention is not limited thereto. In an alternative exemplary embodiment, the number of the column spacers CS may be changed according to a size of a display substrate.

In the exemplary embodiment, the white color filter WC includes the same material as that of the column spacer CS. That is, the white color filter WC and the column spacer CS include material having elasticity with respect to an external pressure. Therefore, it is difficult to define a contact hole in the white color filter WC, and thus defects of a display apparatus may be occurred.

However, in the exemplary embodiment, the red color filter RC is disposed on the light-blocking area of a sub-pixel on which the white color filter WC is disposed. That is, the red color filter RC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

FIGS. 32 to 37 are cross-sectional views illustrating a method of manufacturing the display substrate of FIG. 30.

Figure 32:
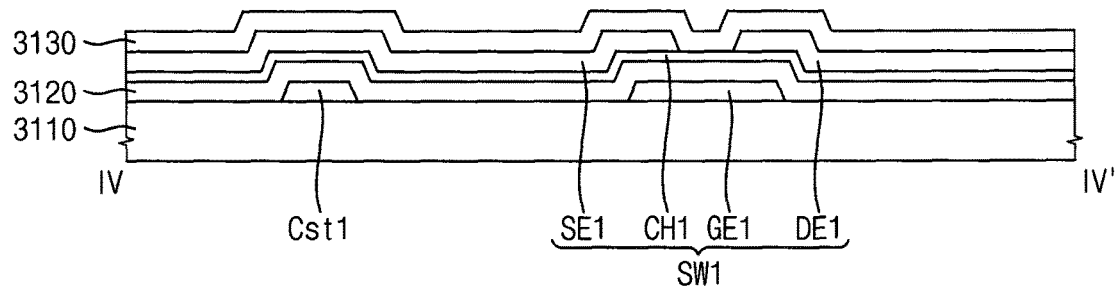
FIGS. 32 to 37 are cross-sectional views illustrating a method of manufacturing the display substrate of FIG. 30.

Referring to FIG. 32, a gate metal layer is disposed on a base substrate 3110, and then the gate metal layer may be partially etched by a photolithography process or an etching process using an additional etching mask. Hence, the gate pattern is provided. The gate pattern includes a first storage line Cst1, a gate line GL, a first gate electrode GE1, a second gate electrode GE2 (refer to FIG. 30) and a third gate electrode GE3 (refer to FIG. 30).

The base substrate 3110 may include a material which has relatively high transmittance, thermal resistance, and chemical resistance. In an exemplary embodiment, the base substrate 3110 may include any one of glass, polyethylenenaphthalate, polyethylene terephthalate, polyacryl and a combination thereof, for example.

The gate pattern may include a metal, a metal alloy, a metal nitride, a conductive metal oxide, a transparent conductive material, and etc. In an exemplary embodiment, the gate pattern may include copper (Cu) which is opaque, for example.

The first insulation layer 3120 is disposed on the base substrate 3110 on which the gate pattern is disposed. The first insulation layer 3120 is disposed on the gate pattern. The first insulation layer 3120 covers and insulates the first storage line Cst1, the gate line GL (refer to FIG. 30), the first gate electrode GE1, the second gate electrode GE2 (refer to FIG. 30) and the third gate electrode GE3 (refer to FIG. 30).

Thereafter, a semiconductor layer and a data metal layer are disposed on the base substrate 110 on which the first insulation layer 3120 is disposed.

In an exemplary embodiment, the semiconductor layer may include a silicon semiconductor layer including amorphous silicon (a-Si:H) and an ohmic contact layer including n+ amorphous silicon (n+ a-Si:H), for example. In an exemplary embodiment, the semiconductor layer may include an oxide semiconductor. In an exemplary embodiment, the oxide semiconductor may include an amorphous oxide including at least one of indium (In), zinc (Zn), gallium (Ga), tin (Sn) and hafnium (Hf), for example.

In an exemplary embodiment, the data metal layer may have a single layer structure including at least one of copper (Cu), silver (Ag), chrome (Cr), molybdenum (Mo), aluminum (Al), titanium (Ti), manganese (Mn) and a combination thereof, for example. In addition, the data metal layer may have a multi layer structure having a plurality of layers including materials different each other. In an exemplary embodiment, the data metal layer may include a copper layer and a titanium layer disposed on and/or under the copper layer.

Thereafter, the semiconductor layer and the data metal layer may be partially etched by a photolithography process or an etching process using an additional etching mask. Hence, a channel layer including a first channel portion CH1, a second channel portion CH2 (refer to FIG. 30) and a third channel portion CH3 (refer to FIG. 30), and data pattern are provided. In an exemplary embodiment, the channel layer may include a silicon semiconductor layer including amorphous silicon (a-Si:H) and an ohmic contact layer including n+ amorphous silicon (n+ a-Si:H), for example. In an exemplary embodiment, the channel layer may include an oxide semiconductor. In an exemplary embodiment, the oxide semiconductor may include an amorphous oxide including at least one of indium (In), zinc (Zn), gallium (Ga), tin (Sn) and hafnium (Hf), for example.

The data pattern includes a first drain electrode DE1, a first source electrode SE1, a second source electrode SE2 (refer to FIG. 30), a second drain electrode DE2 (refer to FIG. 30), a third source electrode SE3 (refer to FIG. 30), a third drain electrode DE3 (refer to FIG. 30), a first data line DL1 and a second data line DL2 (refer to FIG. 1). In an exemplary embodiment, the semiconductor layer and the data metal layer are patterned at the same time, and then a portion of the metal layer, which is patterned, is removed. Hence, the first source electrode SE1 and the first drain electrode DE1 spaced apart from the first source electrode SE1. In addition, the second source electrode SE2 (refer to FIG. 30) and the second drain electrode DE2 (refer to FIG. 30) spaced apart from the second source electrode SE2 (refer to FIG. 30) may be provided by removing a portion of the patterned metal layer. In addition, the third source electrode SE3 (refer to FIG. 30) and the third drain electrode DE3 (refer to FIG. 30) spaced apart from the third source electrode SE3 (refer to FIG. 30) may be provided by removing a portion of the patterned metal layer.

A second insulation layer 3130 is disposed on the base substrate 3110 on which the data pattern and the channel layer are disposed.

In an exemplary embodiment, the second insulation layer 3130 may be provided by a spin coating process, a printing process, a sputtering process, a CVD process, an ALD process, a PECVD process, an HDP-CVD process or a vacuum evaporation process in accordance with ingredients included in the second insulation layer 3130, for example. The second insulation layer 3130 is disposed on the data pattern. The second insulation layer 3130 covers and insulates the first drain electrode DE1, the first source electrode SE1, the second source electrode SE2 (refer to FIG. 30), the second drain electrode DE2 (refer to FIG. 30), the third source electrode SE3 (refer to FIG. 30), the third drain electrode DE3 (refer to FIG. 30) and the data line DL (refer to FIG. 30).

Figure 33:
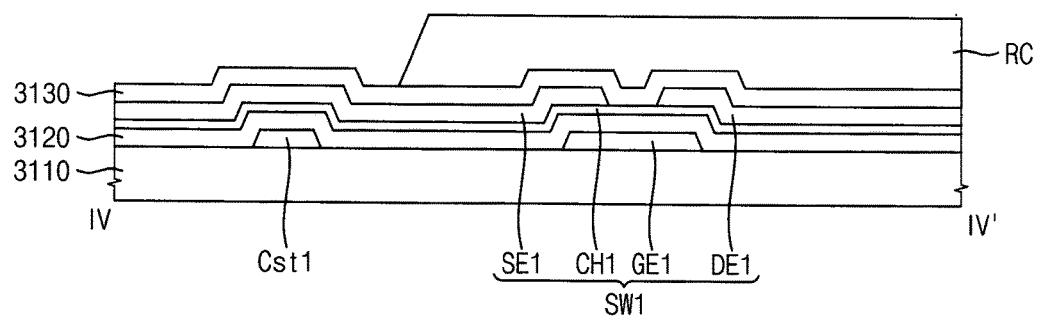

Referring to FIG. 33, an organic layer is disposed on the base substrate 3110 on which the second insulation layer 3130 is disposed. The organic layer may be a color filter layer. A photoresist is disposed on the second insulation layer 3130, and then the photoresist is exposed using a mask, and then the photoresist is developed using a developing solution. Hence, the organic layer may be provided.

The organic layer is disposed on the second insulation layer 3130. When the organic layer is color filter layer, the color filter layer supplies colors to the light passing through the liquid crystal layer. When the organic layer is a color filter layer, the color filter layer may be a color filter layer having a red color filter RC, a green color filter GC or a blue color filter BC. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels. In addition, the red color filter RC, the green color filter GC and the blue color filter BC may be stacked sequentially. However, the invention is not limited thereto. In an alternative exemplary embodiment, a stacking order of the color filters may be changed. In an exemplary embodiment, the green color filter GC, the red color filter RC and the blue color filter BC may be stacked sequentially.

Figure 34:
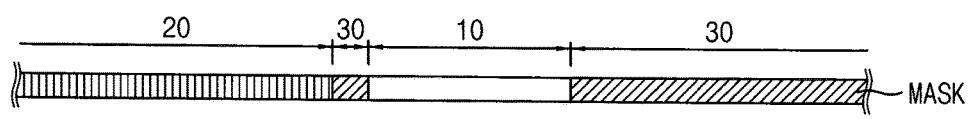
Figure 34:
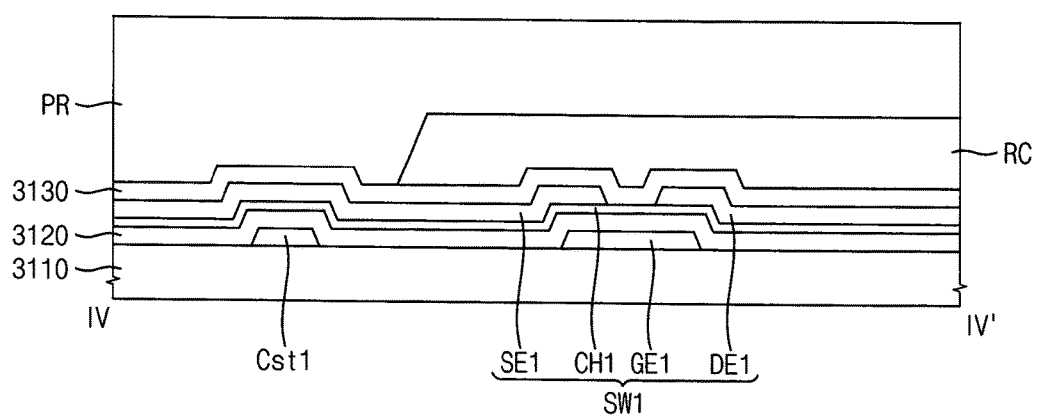

Referring to FIG. 34, a photoresist PR including a transparent material is disposed on the base substrate 3110 on which the red color filter RC is disposed. The photoresist PR may be a negative photosensitive material.

Thereafter, an exposing mask including a transmitting part 10, a shielding part 30, and a diffracting part 20 is arranged on the base substrate 3110. The exposing mask includes a half-tone mask having a half-tone layer provided on an area corresponding to the diffracting part 20. In addition, the exposing mask may include a slit mask including a metal layer having a minute pattern provided on an area corresponding to the diffracting part 20.

When light is irradiated into the exposing mask, the transmitting part 10 transmits the light and the shielding part 30 shields the light. The diffracting part 20 diffracts the light so that some of the light is transmitted through the exposing mask.

When the photoresist PR exposed to the light through the exposing mask is developed, a portion of the photoresist PR corresponding to the shielding part is dissolved to be removed and a portion of the photoresist PR corresponding to the transmitting part 10 remains with a thickness substantially the same as that of the photoresist PR before the photoresist PR is developed. A portion of the photoresist PR remains with a thickness thinner than that of the photoresist PR before the photoresist PR is developed.

Figure 35:
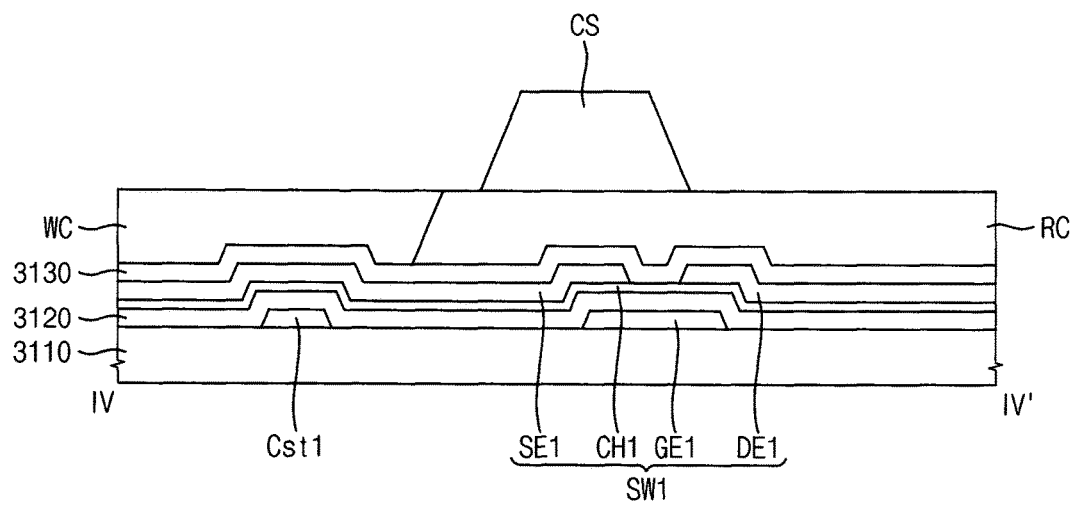

Referring to FIG. 35, the white color filter WC and the column spacer CS are provided.

The column spacer CS maintains a distance between the display substrate and an opposing substrate opposing the display substrate. The column spacer CS may include material having elasticity with respect to an external pressure. The column spacer CS may include a transparent material. In an exemplary embodiment, the column spacer CS may include an acrylic resin. The column spacer CS may include the same material as that of the white color filter WC. The column spacer CS may be provided by the same process as the white color filter WC, for example.

Figure 36:
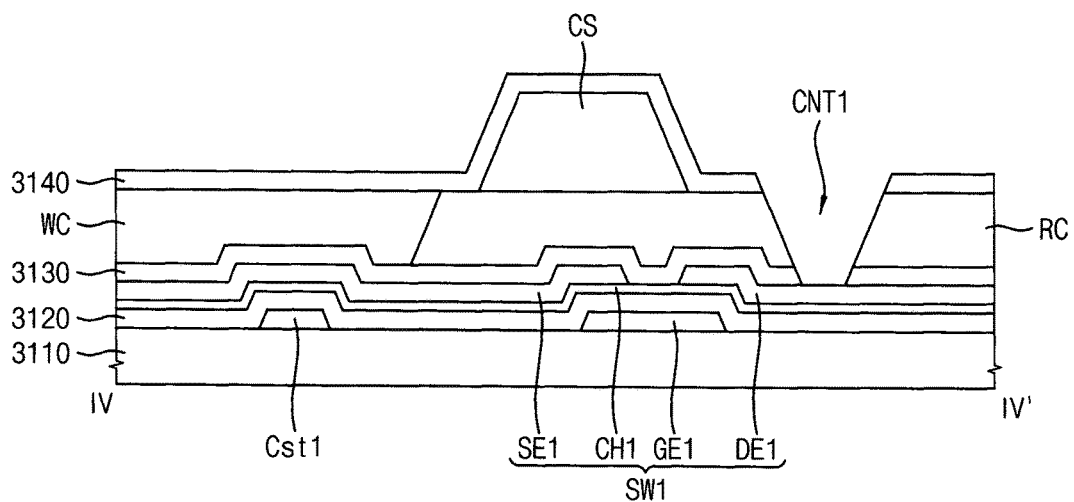

Referring to FIG. 36, a third insulation layer 3140 is disposed on the base substrate 3110 on which the white color filter WC and the column spacer CS are disposed. Thereafter, a first contact hole CNT1 passing the third insulation layer 3140 and the organic layer is defined.

In an exemplary embodiment, the third insulation layer 3140 may be provided by a spin coating process, a printing process, a sputtering process, a CVD process, an ALD process, a PECVD process, an HDP-CVD process or a vacuum evaporation process in accordance with ingredients included in the third insulation layer 3140, for example. The third insulation layer 3140 covers and insulates the organic layer and the column spacer CS.

Thereafter, a first contact hole CNT1 passing the third insulation layer 3140 and the organic layer is defined.

In the exemplary embodiment, the white color filter WC includes the same material as that of the column spacer CS. That is, the white color filter WC and the column spacer CS include material having elasticity with respect to an external pressure. Therefore, it is difficult to define a contact hole in the white color filter WC, and thus defects of a display apparatus may be occurred.

However, in the illustrated exemplary embodiment, the red color filter RC is disposed on the light-blocking area of a sub-pixel on which the white color filter WC is disposed. That is, the red color filter RC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

Figure 37:
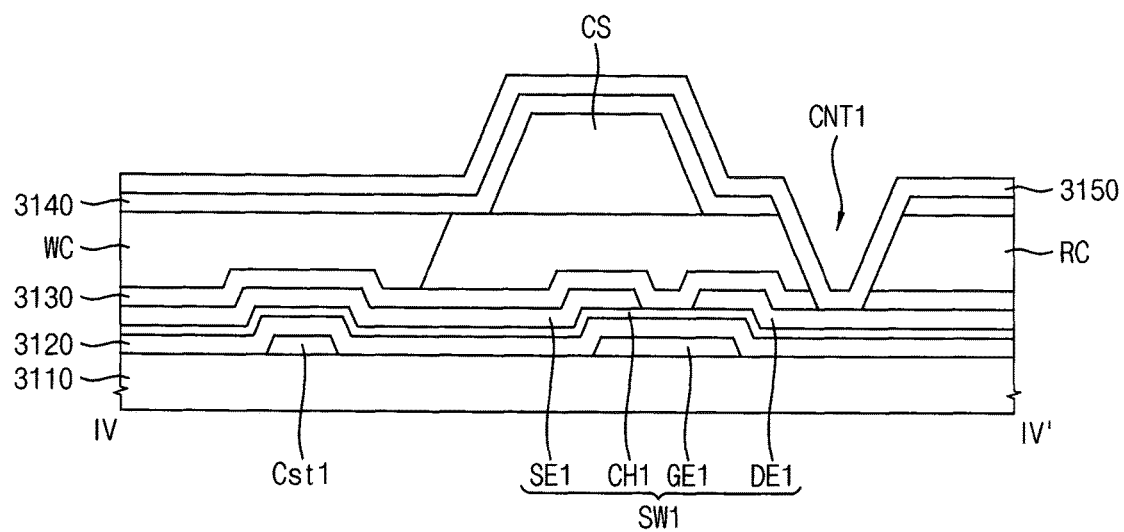

Referring to FIG. 37, a transparent conductive layer 3150 is disposed on the base substrate 3110 in which the first contact hole CNT1 is defined.

In an exemplary embodiment, the transparent conductive layer 3150 may include a transparent conductive material, such as ITO and IZO. In an exemplary embodiment, the transparent conductive layer 3150 may include titanium (Ti) and/or molybdenum titanium (MoTi), for example.

Referring to FIG. 31, the transparent conductive layer 3150 is patterned to provide a shielding electrode SC and a pixel electrode. The pixel electrode may include a high-pixel electrode PE1 and a low-pixel electrode PE2.

In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

According to the exemplary embodiment, the red color filter RC is disposed on the light-blocking area of a sub-pixel on which the white color filter WC is disposed. That is, the red color filter RC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

Figure 38:
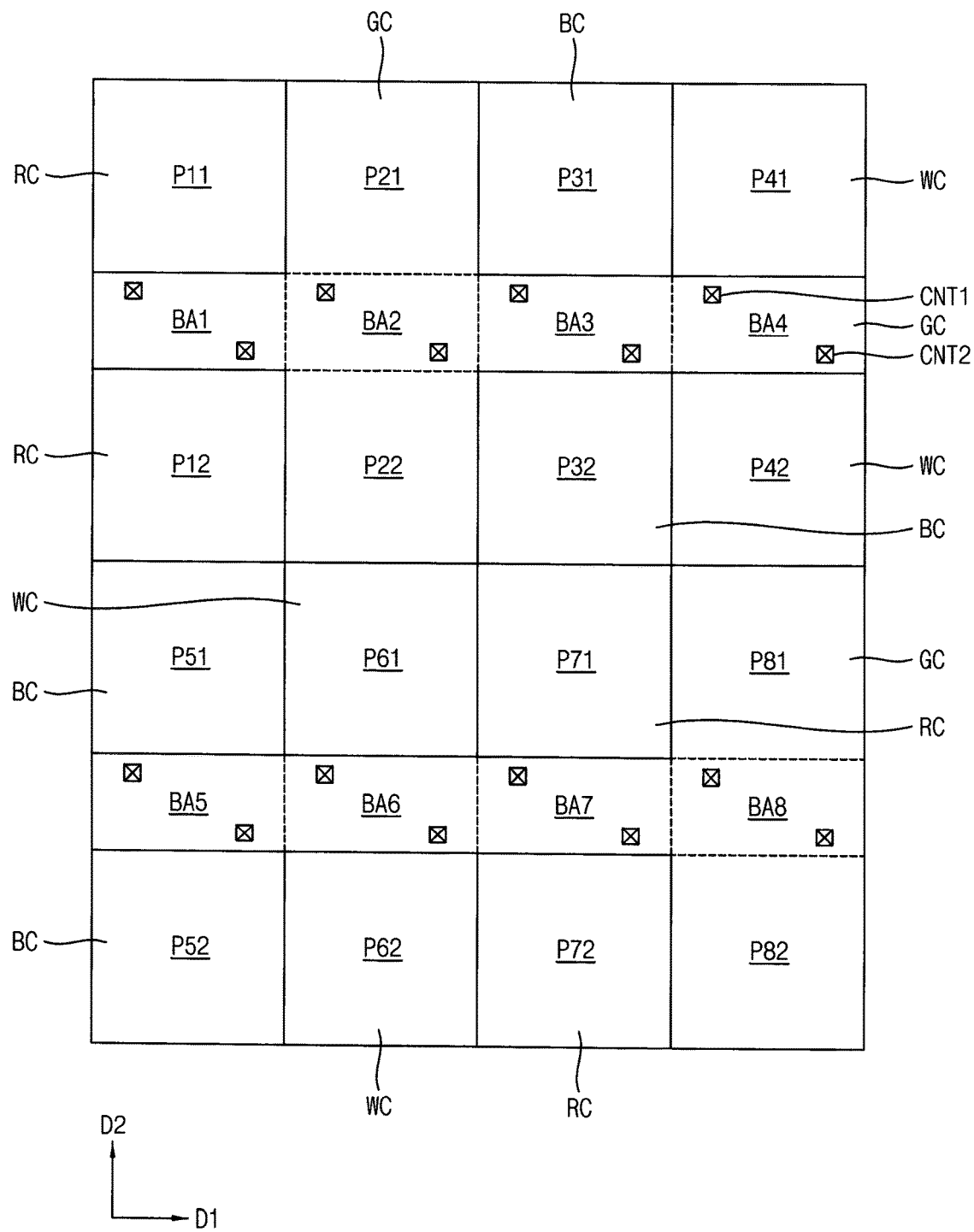
FIG. 38 is a plan view illustrating an exemplary embodiment of a color filter according to the invention.
Figure 39:
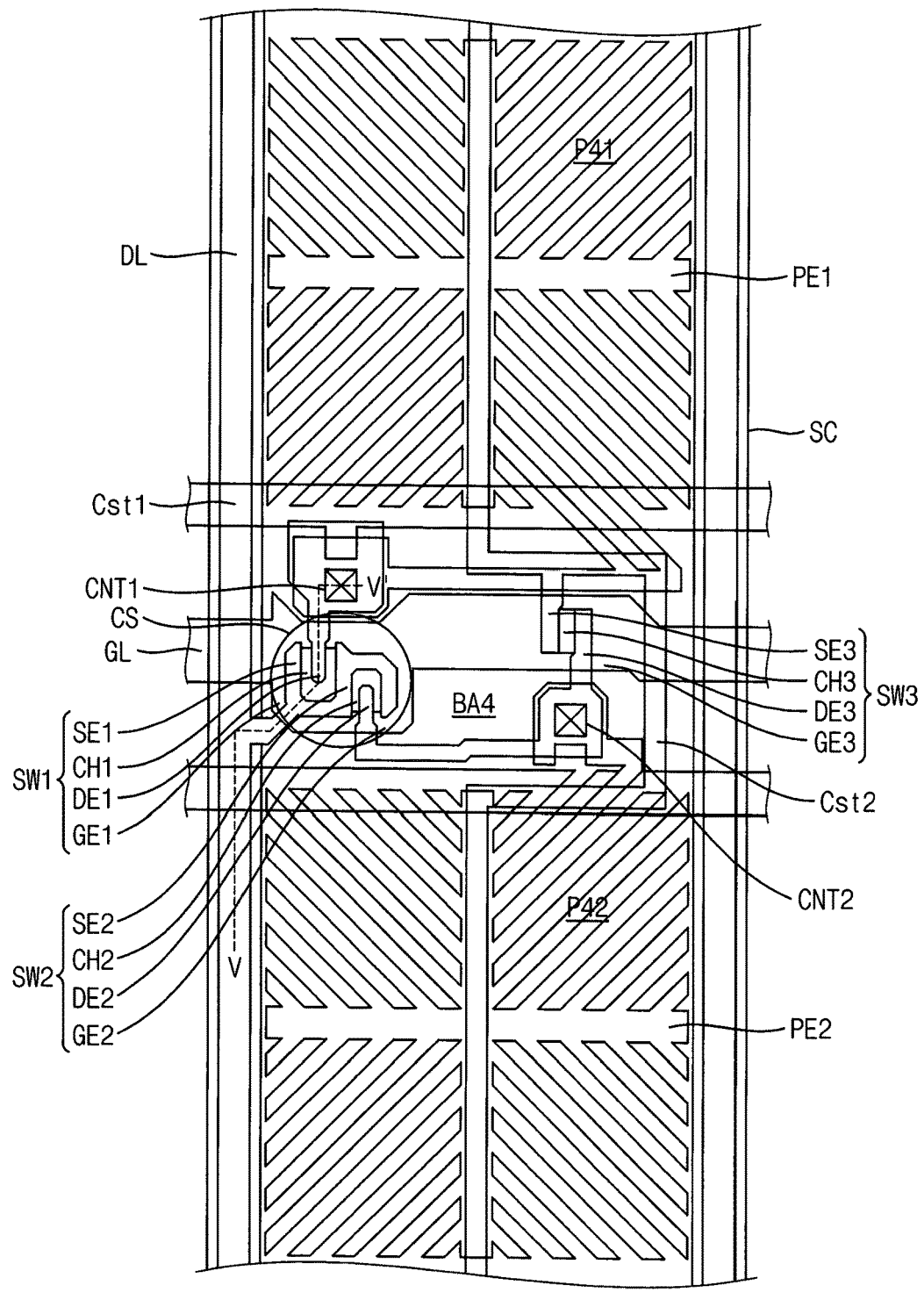
FIG. 39 is a plan view illustrating an exemplary embodiment of a unit pixel according to the invention.
Figure 40:
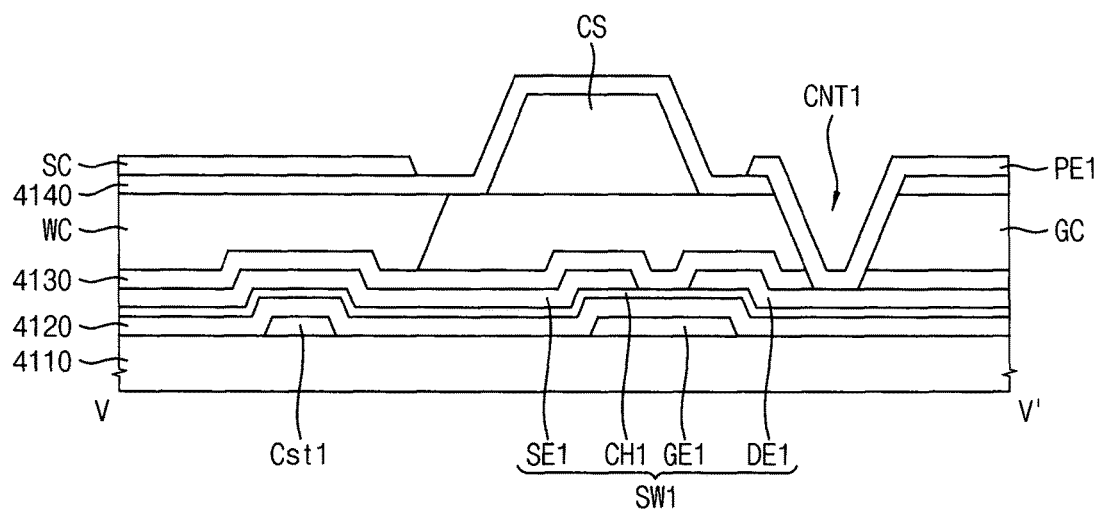
FIG. 40 is a cross-sectional view taken along line V-V' of FIG. 39.

FIG. 38 is a plan view illustrating a color filter according to an exemplary embodiment of the invention. FIG. 39 is a plan view illustrating a unit pixel according to an exemplary embodiment of the invention. FIG. 40 is a cross-sectional view taken along line V-V' of FIG. 39.

The display substrate according to the exemplary embodiment is substantially same as the display substrate of the FIGS. 1 to 10 except for a red color filter RC, a green color filter GC, a blue color filter BC and a white color filter WC, and thus same reference numerals are used for same elements and repetitive explanation will be omitted.

Referring to FIGS. 1, 38 to 40, a display substrate includes a gate line GL, a data line DL, a first storage line Cst1, a second storage line Cst2, a first switching element SW1, a second switching element SW2, a third switching element SW3, a high-pixel electrode PE1 and a low-pixel electrode PE2.

An organic layer is disposed on the second insulation layer 4130. The organic layer planarizes an upper surface of the substrate so that problems due to the step such as disconnection of a signal line may be prevented. The organic layer may be an insulation layer including an organic material. In an exemplary embodiment, the organic layer may a color filter layer.

When the organic layer is a color filter layer, the color filter layer may be a color filter layer having a red color filter RC, a green color filter GC, a blue color filter BC or a white color filter WC. In addition, the red color filter RC, the green color filter GC, the blue color filter BC and the white color filter WC may be stacked sequentially.

A display substrate according to an exemplary embodiment of the invention may include a plurality of sub-pixels. The red color filter RC, the green color filter GC, the blue color filter BC and the white color filter WC may be disposed on sub-pixel respectively.

The sub-pixel of the display substrate may include a light-blocking area, a high-pixel area disposed adjacent to the light-blocking area and a low-pixel area disposed opposite to the high-pixel area with reference to the light-blocking area. The red color filter RC, the green color filter GC, the blue color filter BC and the white color filter WC may be disposed on a light-blocking area, a high-pixel area and a low-pixel area of the sub-pixel respectively.

The red color filter RC is disposed on a first high-pixel area P11 of a first sub-pixel and a first low-pixel area P12 of the first sub-pixel. The first sub-pixel includes a first high-pixel area P11, a first low-pixel area P12 and a first light-blocking area BA1. The green color filter GC is disposed on the first light-blocking area BA1. The first high-pixel area P11 is disposed adjacent to the first light-blocking area BA1. The first low-pixel area P12 is disposed opposite to the first high-pixel area P11 with reference to the first light-blocking area BA1. The high-pixel electrode PE1 may be disposed on the first high-pixel area P11. The low-pixel electrode PE2 may be disposed on the first low-pixel area P12. The first switching element SW1, the second switching element SW2 and the third switching element SW3 may be disposed on the first light-blocking area BA1. In addition, contact holes exposing a portion of the first switching element SW1, the second switching element SW2 and the third switching element SW3 may be defined in the first light-blocking area BA1.

The green color filter GC is disposed on a second sub-pixel, the first light-blocking area BA1, the third light-blocking area BA3 and the fourth light-blocking area BA4. The second sub-pixel includes a second high-pixel area P21, a second low-pixel area P22 and a second light-blocking area BA2. The blue color filter BC is disposed on the second light-blocking area BA2. The second high-pixel area P21 is disposed adjacent to the second light-blocking area BA2. The second low-pixel area P22 is disposed opposite to the second high-pixel area P21 with reference to the second light-blocking area BA2. The high-pixel electrode PE1 may be disposed on the second high-pixel area P21. The low-pixel electrode PE2 may be disposed on the second low-pixel area P22. The first switching element SW1, the second switching element SW2 and the third switching element SW3 may be disposed on the second light-blocking area BA2. In addition, contact holes exposing a portion of the first switching element SW1, the second switching element SW2 and the third switching element SW3 may be defined in the second light-blocking area BA2.

The blue color filter BC is disposed on a third high-pixel area P31 of a third sub-pixel and a third low-pixel area P32 of the third sub-pixel. The third sub-pixel includes a third high-pixel area P31, a third low-pixel area P32 and a third light-blocking area BA3. The green color filter GC is disposed on the third light-blocking area BA3. The third high-pixel area P31 is disposed adjacent to the third light-blocking area BA3. The third low-pixel area P32 is disposed opposite to the third high-pixel area P31 with reference to the third light-blocking area BA3. The high-pixel electrode PE1 may be disposed on the third high-pixel area P31. The low-pixel electrode PE2 may be disposed on the third low-pixel area P32. The first switching element SW1, the second switching element SW2 and the third switching element SW3 may be disposed on the third light-blocking area BA3. In addition, contact holes exposing a portion of the first switching element SW1, the second switching element SW2 and the third switching element SW3 may be defined in the third light-blocking area BA3.

The white color filter WC is disposed on a fourth high-pixel area P41 of a fourth sub-pixel and a fourth low-pixel area P42 of the fourth sub-pixel. The fourth sub-pixel includes a fourth high-pixel area P41, a fourth low-pixel area P42 and a fourth light-blocking area BA4. The green color filter GC is disposed on the fourth light-blocking area BA4. The fourth high-pixel area P41 is disposed adjacent to the fourth light-blocking area BA4. The fourth low-pixel area P42 is disposed opposite to the fourth high-pixel area P41 with reference to the fourth light-blocking area BA4. The high-pixel electrode PE1 may be disposed on the fourth high-pixel area P41. The low-pixel electrode PE2 may be disposed on the fourth low-pixel area P42. The first switching element SW1, the second switching element SW2 and the third switching element SW3 may be disposed on the fourth light-blocking area BA4. In addition, contact holes exposing a portion of the first switching element SW1, the second switching element SW2 and the third switching element SW3 may be defined in the fourth light-blocking area BA4.

A column spacer CS is disposed on the organic layer. The column spacer CS maintains a distance between the display substrate and an opposing substrate opposing the display substrate. The column spacer CS may include material having elasticity with respect to an external pressure. In an exemplary embodiment, the column spacer CS may include an acrylic resin. The column spacer CS may include the same material as that of the white color filter WC. The column spacer CS may be provided by the same process as the white color filter WC.

The column spacer CS may be overlapped with the first switching element SW1. In the illustrated exemplary embodiment, one column spacer CS is disposed on the plurality of sub-pixels. However, the invention is not limited thereto. In an alternative exemplary embodiment, the number of the column spacers CS may be changed according to a size of a display substrate.

In the illustrated exemplary embodiment, the white color filter WC includes the same material as that of the column spacer CS. That is, the white color filter WC and the column spacer CS include material having elasticity with respect to an external pressure. Therefore, it is difficult to define a contact hole in the white color filter WC, and thus defects of a display apparatus may be occurred.

However, in the exemplary embodiment, the green color filter GC is disposed on the light-blocking area of a sub-pixel on which the white color filter WC is disposed. That is, the green color filter GC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

FIGS. 41 to 46 are cross-sectional views illustrating a method of manufacturing the display substrate of FIG. 39.

Figure 41:
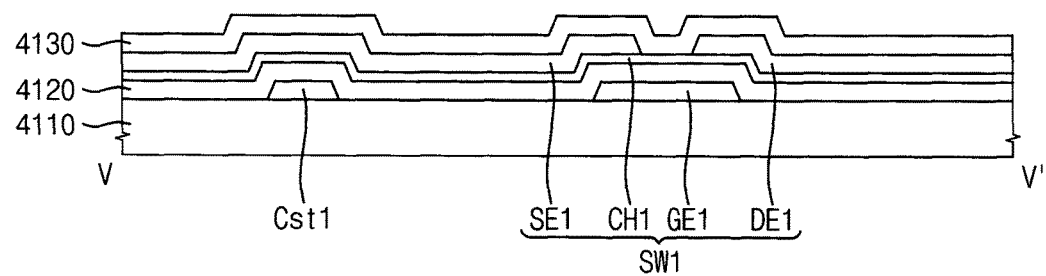
FIGS. 41 to 46 are cross-sectional views illustrating a method of manufacturing the display substrate of FIG. 39.

Referring to FIG. 41, a gate metal layer is disposed on a base substrate 4110, and then the gate metal layer may be partially etched by a photolithography process or an etching process using an additional etching mask. Hence, the gate pattern is provided. The gate pattern includes a first storage line Cst1, a gate line GL, a first gate electrode GE1, a second gate electrode GE2 (refer to FIG. 39) and a third gate electrode GE3 (refer to FIG. 39).

The base substrate 4110 may include a material which has relatively high transmittance, thermal resistance, and chemical resistance. In an exemplary embodiment, the base substrate 4110 may include any one of glass, polyethylenenaphthalate, polyethylene terephthalate, polyacryl and a combination thereof, for example.

The gate pattern may include a metal, a metal alloy, a metal nitride, a conductive metal oxide, a transparent conductive material, and etc. In an exemplary embodiment, the gate pattern may include copper (Cu) which is opaque, for example.

The first insulation layer 4120 is disposed on the base substrate 4110 on which the gate pattern is disposed. The first insulation layer 4120 is disposed on the gate pattern. The first insulation layer 4120 covers and insulates the first storage line Cst1, the gate line GL, the first gate electrode GE1, the second gate electrode GE2 (refer to FIG. 39) and the third gate electrode GE3 (refer to FIG. 39).

Thereafter, a semiconductor layer and a data metal layer are disposed on the base substrate 4110 on which the first insulation layer 4120 is disposed. In an exemplary embodiment, the semiconductor layer may include a silicon semiconductor layer including amorphous silicon (a-Si:H) and an ohmic contact layer including n+ amorphous silicon (n+ a-Si:H), for example. In an exemplary embodiment, the semiconductor layer may include an oxide semiconductor. In an exemplary embodiment, the oxide semiconductor may include an amorphous oxide including at least one of indium (In), zinc (Zn), gallium (Ga), tin (Sn) and hafnium (Hf), for example.

In an exemplary embodiment, the data metal layer may have a single layer structure including at least one of copper (Cu), silver (Ag), chrome (Cr), molybdenum (Mo), aluminum (Al), titanium (Ti), manganese (Mn) and a combination thereof, for example. In addition, the data metal layer may have a multi layer structure having a plurality of layers including materials different each other. In an exemplary embodiment, the data metal layer may include a copper layer and a titanium layer disposed on and/or under the copper layer.

Thereafter, the semiconductor layer and the data metal layer may be partially etched by a photolithography process or an etching process using an additional etching mask. Hence, a channel layer including a first channel portion CH1, a second channel portion CH2 and a third channel portion CH3, and data pattern are provided. In an exemplary embodiment, the channel layer may include a silicon semiconductor layer including amorphous silicon (a-Si:H) and an ohmic contact layer including n+ amorphous silicon (n+ a-Si:H), for example. In an exemplary embodiment, the channel layer may include an oxide semiconductor. In an exemplary embodiment, the oxide semiconductor may include an amorphous oxide including at least one of indium (In), zinc (Zn), gallium (Ga), tin (Sn) and hafnium (Hf), for example.

The data pattern includes a first drain electrode DE1, a first source electrode SE1, a second source electrode SE2 (refer to FIG. 39), a second drain electrode DE2 (refer to FIG. 39), a third source electrode SE3 (refer to FIG. 39), a third drain electrode DE3 (refer to FIG. 39), a first data line DL1 and a second data line DL2 (refer to FIG. 1). In an exemplary embodiment, the semiconductor layer and the data metal layer are patterned at the same time, and then a portion of the metal layer, which is patterned, is removed. Hence, the first source electrode SE1 and the first drain electrode DE1 spaced apart from the first source electrode SE1. In addition, the second source electrode SE2 (refer to FIG. 39) and the second drain electrode DE2 (refer to FIG. 39) spaced apart from the second source electrode SE2 may be provided by removing a portion of the patterned metal layer. In addition, the third source electrode SE3 (refer to FIG. 39) and the third drain electrode DE3 (refer to FIG. 39) spaced apart from the third source electrode SE3 (refer to FIG. 39) may be provided by removing a portion of the patterned metal layer.

A second insulation layer 4130 is disposed on the base substrate 4110 on which the data pattern and the channel layer are disposed.

In an exemplary embodiment, the second insulation layer 130 may be provided by a spin coating process, a printing process, a sputtering process, a CVD process, an ALD process, a PECVD process, an HDP-CVD process or a vacuum evaporation process in accordance with ingredients included in the second insulation layer 130, for example. The second insulation layer 130 is disposed on the data pattern. The second insulation layer 4130 covers and insulates the first drain electrode DE1, the first source electrode SE1, the second source electrode SE2 (refer to FIG. 39), the second drain electrode DE2 (refer to FIG. 39), the third source electrode SE3 (refer to FIG. 39), the third drain electrode DE3 (refer to FIG. 39) and the data line DL (refer to FIG. 39).

Figure 42:
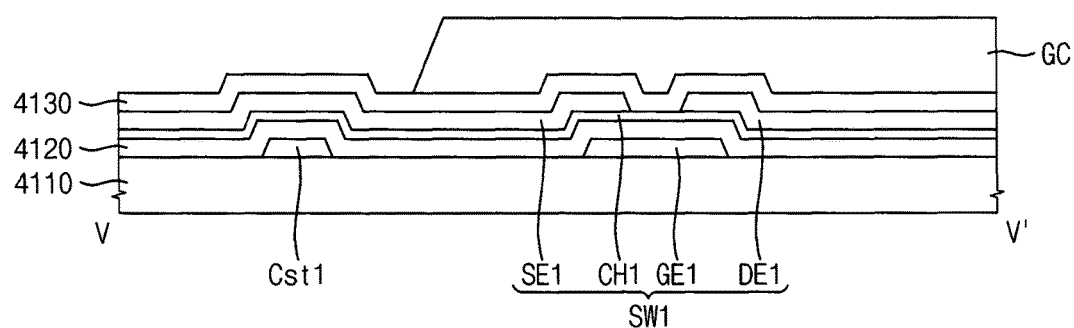

Referring to FIG. 42, an organic layer is disposed on the base substrate 4110 on which the second insulation layer 4130 is disposed. The organic layer may be a color filter layer. A photoresist is disposed on the second insulation layer 4130, and then the photoresist is exposed using a mask, and then the photoresist is developed using a developing solution. Hence, the organic layer may be provided.

The organic layer is disposed on the second insulation layer 4130. When the organic layer is color filter layer, the color filter layer supplies colors to the light passing through the liquid crystal layer. When the organic layer is a color filter layer, the color filter layer may be a color filter layer having a red color filter RC, a green color filter GC or a blue color filter BC. The color filter layer corresponds to a unit pixel. The color filter layers adjacent to each other may have different colors. The color filter layer may be overlapped with adjacent color filter layer in a boundary of the adjacent unit pixels. In addition, the color filter layer may be spaced apart from adjacent color filter layer in the boundary of the adjacent unit pixels. In an exemplary embodiment, the red color filter RC, the green color filter GC and the blue color filter BC may be stacked sequentially, for example. However, the invention is not limited thereto. In an alternative exemplary embodiment, a stacking order of the color filters may be changed. In an exemplary embodiment, the green color filter GC, the red color filter RC and the blue color filter BC may be stacked sequentially.

Figure 43:
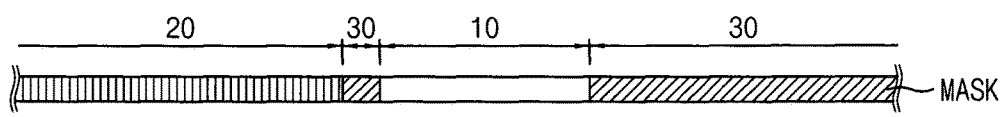
Figure 43:
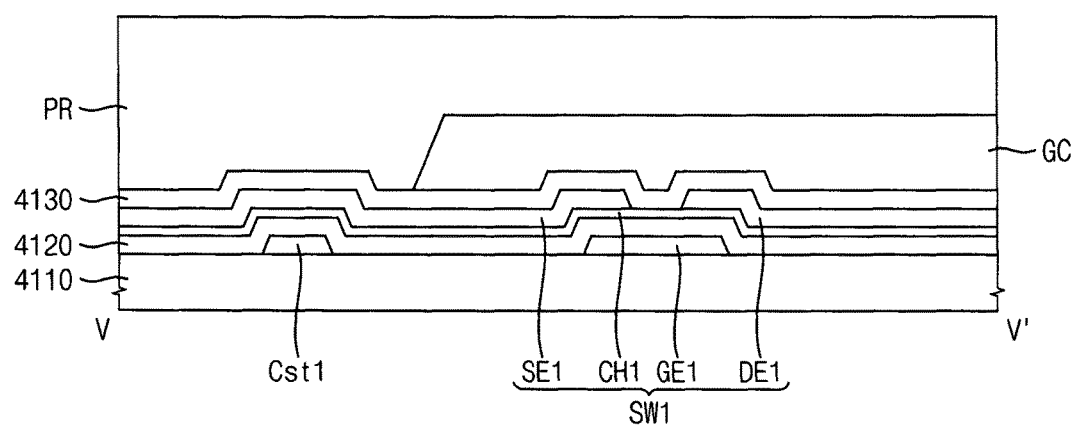

Referring to FIG. 43, a photoresist PR including a transparent material is disposed on the base substrate 4110 on which the green color filter GC is disposed. The photoresist PR may be a negative photosensitive material.

Thereafter, an exposing mask including a transmitting part 10, a shielding part 30, and a diffracting part 20 is arranged on the base substrate 110. The exposing mask includes a half-tone mask having a half-tone layer disposed on an area corresponding to the diffracting part 20. In addition, the exposing mask may include a slit mask including a metal layer having a minute pattern disposed on an area corresponding to the diffracting part 20.

When light is irradiated into the exposing mask, the transmitting part 10 transmits the light and the shielding part 30 shields the light. The diffracting part 20 diffracts the light so that some of the light is transmitted through the exposing mask.

When the photoresist PR exposed to the light through the exposing mask is developed, a portion of the photoresist PR corresponding to the shielding part is dissolved to be removed and a portion of the photoresist PR corresponding to the transmitting part 10 remains with a thickness substantially the same as that of the photoresist PR before the photoresist PR is developed. A portion of the photoresist PR remains with a thickness thinner than that of the photoresist PR before the photoresist PR is developed.

Figure 44:
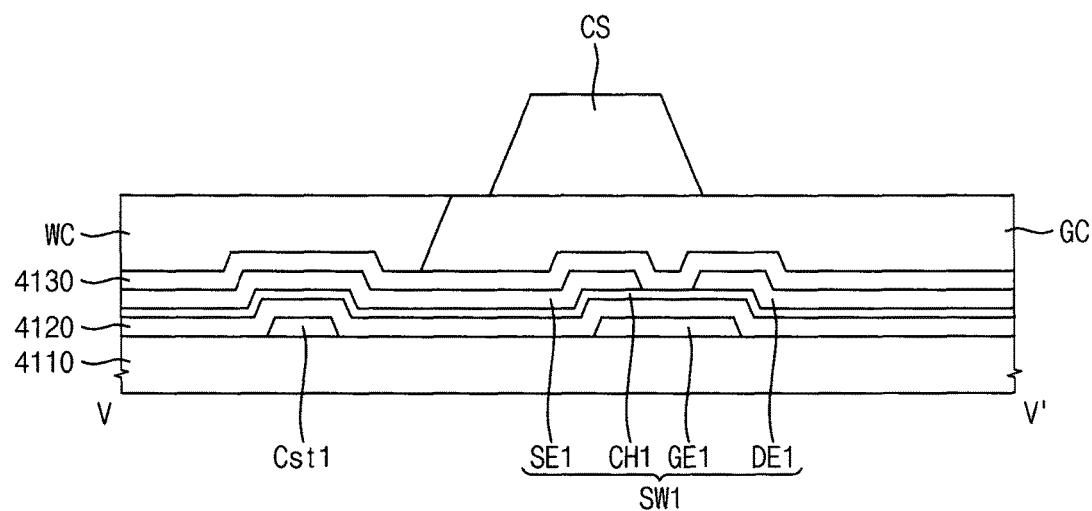
Figure 45:
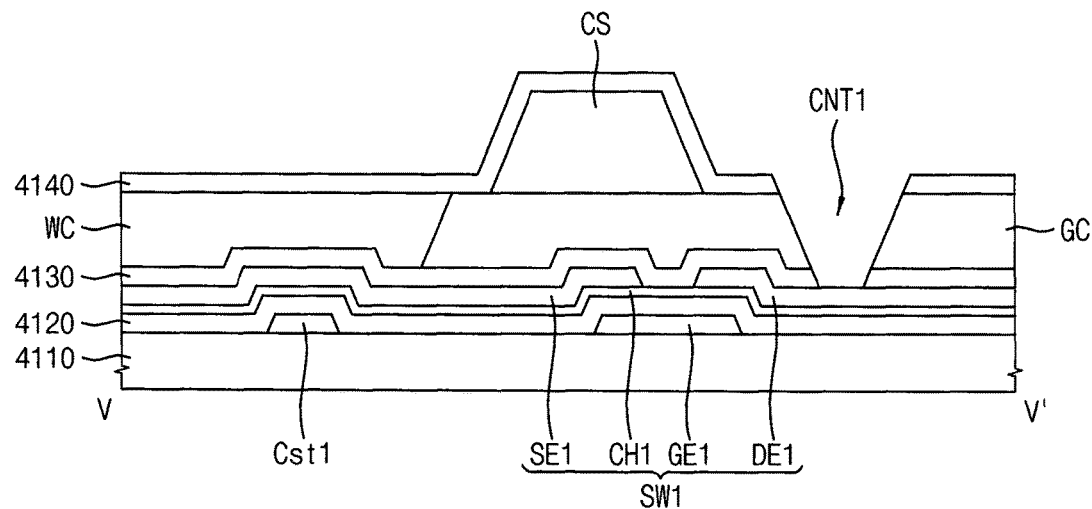

Referring to FIG. 44, the white color filter WC and the column spacer CS are provided.

The column spacer CS maintains a distance between the display substrate and an opposing substrate opposing the display substrate. The column spacer CS may include material having elasticity with respect to an external pressure. The column spacer CS may include a transparent material.

In an exemplary embodiment, the column spacer CS may include an acrylic resin. The column spacer CS may include the same material as that of the white color filter WC. The column spacer CS may be provided by the same process as the white color filter WC, for example.

Figure 46:
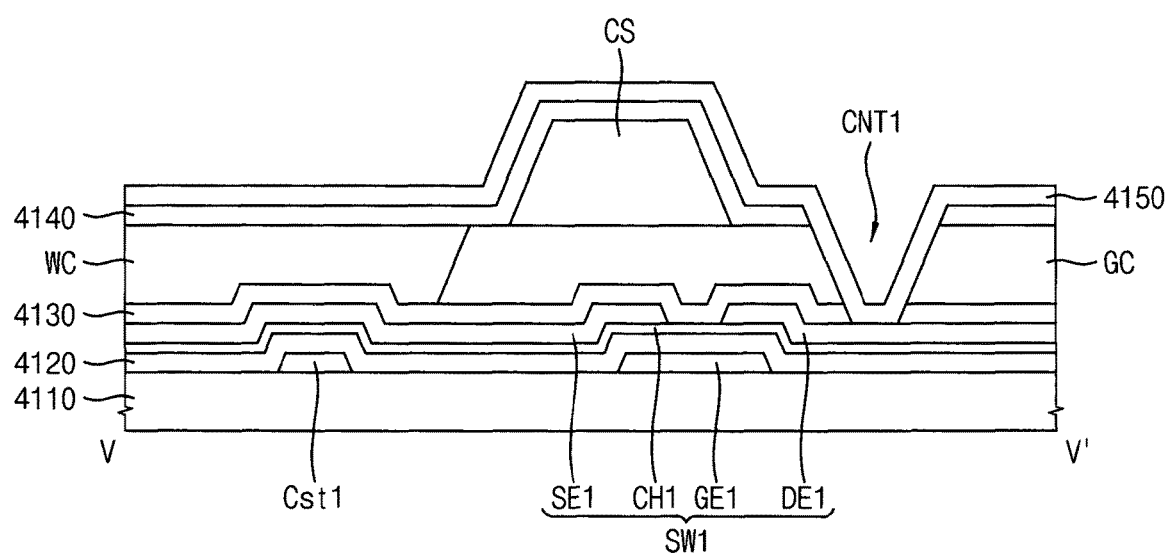

Referring to FIG. 46, a third insulation layer 4140 is disposed on the base substrate 4110 on which the white color filter WC and the column spacer CS are disposed. Thereafter, a first contact hole CNT1 passing the third insulation layer 4140 and the organic layer is defined.

In an exemplary embodiment, the third insulation layer 4140 may be provided by a spin coating process, a printing process, a sputtering process, a CVD process, an ALD process, a PECVD process, an HDP-CVD process or a vacuum evaporation process in accordance with ingredients included in the third insulation layer 4140, for example. The third insulation layer 4140 covers and insulates the organic layer and the column spacer CS.

Thereafter, a first contact hole CNT1 passing the third insulation layer 4140 and the organic layer is defined.

In the exemplary embodiment, the white color filter WC includes the same material as that of the column spacer CS. That is, the white color filter WC and the column spacer CS include material having elasticity with respect to an external pressure. Therefore, it is difficult to define a contact hole in the white color filter WC, and thus defects of a display apparatus may be occurred.

However, in the exemplary embodiment, the green color filter GC is disposed on the light-blocking area of a sub-pixel on which the white color filter WC is disposed. That is, the green color filter GC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

Referring to FIG. 46, a transparent conductive layer 4150 is disposed on the base substrate 4110 in which the first contact hole CNT1 is defined.

In an exemplary embodiment, the transparent conductive layer 4150 may include a transparent conductive material, such as ITO and IZO. In an exemplary embodiment, the transparent conductive layer 4150 may include titanium (Ti) and/or molybdenum titanium (MoTi), for example.

Referring to FIG. 40, the transparent conductive layer 4150 is patterned to provide a shielding electrode SC and a pixel electrode. The pixel electrode may include a high-pixel electrode PE1 and a low-pixel electrode PE2.

In an exemplary embodiment, the shielding electrode SC may include a transparent conductive material, such as ITO and IZO. In an exemplary embodiment, the shielding electrode SC may include titanium (Ti) and/or molybdenum titanium (MoTi), for example.

The high-pixel electrode PE1 and the low-pixel electrode PE2 may be provided from the same layer as the shielding electrode SC. In an exemplary embodiment, the high-pixel electrode PE1 and the low-pixel electrode PE2 may include a transparent conductive material, such as ITO and IZO. In an exemplary embodiment, the high-pixel electrode PE1 and the low-pixel electrode PE2 may include titanium (Ti) and/or molybdenum titanium (MoTi), for example.

According to the exemplary embodiment, the green color filter GC is disposed on the light-blocking area of a sub-pixel on which the white color filter WC is disposed. That is, the green color filter GC is disposed on the fourth light-blocking area BA4. Thus, contact holes may be defined ordinarily in the light-blocking area of a sub-pixel on which the white color filter WC is disposed. Accordingly, defects of a display apparatus may be decreased. In addition, the white color filter WC is provided by the same process as the column spacer CS, and thus the number of the masks may be decreased. Accordingly, manufacturing cost and manufacturing time may be decreased.

According to the exemplary embodiment, the red color filter, the green color filter or the blue color filter is disposed on the light-blocking area of a sub-pixel on which the white color filter is disposed. Thus, contact holes may be defined ordinarily in the light-blocking area of a sub-pixel on which the white color filter. Accordingly, defects of a display apparatus may be decreased.

In addition, the white color filter is provided by the same process as the column spacer, and thus the number of the masks may be decreased. Accordingly, manufacturing cost and manufacturing time may be decreased.

The foregoing is illustrative of the invention and is not to be construed as limiting thereof. Although a few exemplary embodiments of the invention have been described, those skilled in the art will readily appreciate that many modifications are possible in the exemplary embodiments without materially departing from the novel teachings and advantages of the invention. Accordingly, all such modifications are intended to be included within the scope of the invention as defined in the claims. In the claims, means-plus-function clauses are intended to cover the structures described herein as performing the recited function and not only structural equivalents but also equivalent structures. Therefore, it is to be understood that the foregoing is illustrative of the invention and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A display substrate comprising:
   a base substrate comprising a plurality of sub-pixels;
   a first switching element disposed on the base substrate and electrically connected to a gate line extending in a first direction and a data line extending in a second direction crossing the first direction;
   a color filter layer disposed on the first switching element and comprising a red color filter, a green color filter, a blue color filter and a white color filter alternately disposed on the plurality of sub-pixels, respectively;
   a column spacer disposed on the color filter layer and comprising the same material as that of the white color filter;
   an insulation layer disposed on the base substrate on which the color filter layer and the column spacer are disposed; and
   a pixel electrode disposed on the insulation layer.

2. The display substrate of claim 1, wherein the plurality of sub-pixels comprise:
   a light-blocking area;
   a high-pixel area disposed adjacent to the light-blocking area; and
   a low-pixel area disposed opposite to the high-pixel area with reference to the light-blocking area.

3. The display substrate of claim 2,
   wherein the red color filter is disposed on a first sub-pixel, and
   the green color filter is disposed on a second sub-pixel adjacent to the first sub-pixel, and
   the blue color filter is disposed on a third sub-pixel adjacent to the second sub-pixel and a light-blocking area of a fourth sub-pixel adjacent to the third sub-pixel, and
   the white color filter is disposed on a high-pixel area of the fourth sub-pixel and a low-pixel area of the fourth sub-pixel.

4. The display substrate of claim 2,
   wherein the red color filter is disposed on a high-pixel area of a first sub-pixel and a low-pixel area of the first sub-pixel,
   the green color filter is disposed on a high-pixel area of a second sub-pixel adjacent to the first sub-pixel and a low-pixel area of the second sub-pixel,
   the blue color filter is disposed on a third sub-pixel adjacent to the second sub-pixel, a light-blocking area of the first sub-pixel, a light-blocking area of the second sub-pixel and a light-blocking area of a fourth sub-pixel adjacent to the third sub-pixel, and
   the white color filter is disposed on a high-pixel area of the fourth sub-pixel and a low-pixel area of the fourth sub-pixel.

5. The display substrate of claim 2,
   wherein the red color filter is disposed on a first sub-pixel and a light-blocking area of a fourth sub-pixel adjacent to the first sub-pixel,
   the green color filter is disposed on a second sub-pixel adjacent to the first sub-pixel,
   the blue color filter is disposed on a third sub-pixel adjacent to the second sub-pixel, and
   the white color filter is disposed on a high-pixel area of the fourth sub-pixel and a low-pixel area of the fourth sub-pixel.

6. The display substrate of claim 2,
   wherein the red color filter is disposed on a first sub-pixel, a light-blocking area of a second sub-pixel adjacent to the first sub-pixel, a light-blocking area of a third sub-pixel adjacent to the second sub-pixel and a light-blocking area of a fourth sub-pixel adjacent to the first sub-pixel,
   the green color filter is disposed on a high-pixel area of the second sub-pixel and a low-pixel area of the second sub-pixel,
   the blue color filter is disposed on a high-pixel area of the third sub-pixel and a low-pixel area of the third sub-pixel, and
   the white color filter is disposed on a high-pixel area of the fourth sub-pixel and a low-pixel area of the fourth sub-pixel.

7. The display substrate of claim 2,
   wherein the red color filter is disposed on a high-pixel area of a first sub-pixel and a low-pixel area of the first sub-pixel,
   the green color filter is disposed on a second sub-pixel adjacent to the first sub-pixel, a light-blocking area of the first sub-pixel, a light-blocking area of a third sub-pixel adjacent to the second sub-pixel and a light-blocking area of a fourth sub-pixel adjacent to the first sub-pixel,
   the blue color filter is disposed on a high-pixel area of the third sub-pixel and a low-pixel area of the third sub-pixel, and
   the white color filter is disposed on a high-pixel area of the fourth sub-pixel and a low-pixel area of the fourth sub-pixel.

8. The display substrate of claim 2, wherein the pixel electrode is electrically connected to the first switching element through a contact hole passing the color filter layer disposed on the light-blocking area.

9. The display substrate of claim 1, wherein the pixel electrode comprises:
   a high-pixel electrode; and
   a low-pixel electrode spaced apart from the high-pixel electrode.

10. The display substrate of claim 9, further comprising:
    a second switching element electrically connected to the gate line, the data line and the low-pixel electrode;
    a third switching element electrically connected to the gate line and the second switching element, and
    wherein the first switching element is electrically connected to the high-pixel electrode.

* * * * *